(12) United States Patent
Park et al.

(10) Patent No.: US 10,820,417 B2
(45) Date of Patent: Oct. 27, 2020

(54) DISPLAY APPARATUS AND METHOD FOR MANUFACTURING THE SAME

(71) Applicant: SAMSUNG DISPLAY CO., LTD., Yongin-Si, Gyeonggi-Do (KR)

(72) Inventors: Jinhyuk Park, Hwaseong-Si (KR); Toru Tsunekawa, Hwaseong-Si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/503,703

(22) Filed: Jul. 5, 2019

(65) Prior Publication Data
US 2020/0015356 A1 Jan. 9, 2020

(30) Foreign Application Priority Data
Jul. 6, 2018 (KR) .................. 10-2018-0078996

(51) Int. Cl.
*H05K 1/00* (2006.01)
*H05K 1/14* (2006.01)
(Continued)

(52) U.S. Cl.
CPC ............. *H05K 1/147* (2013.01); *H05K 1/189* (2013.01); *H05K 3/361* (2013.01); *G02B 6/0031* (2013.01);
(Continued)

(58) Field of Classification Search
USPC ........................................ 361/749
See application file for complete search history.

(56) References Cited

U.S. PATENT DOCUMENTS 9,426,890 B2  8/2016  Jang et al.
9,723,712 B2  8/2017  Cho
(Continued)

FOREIGN PATENT DOCUMENTS

CN   105118386   12/2015
KR   10-1538365   7/2015
(Continued)

OTHER PUBLICATIONS

Examination Report dated Oct. 23, 2019 from the European Patent Office in corresponding European Patent Application No. 19183260.9.

*Primary Examiner* — Andargie M Aychillhum
(74) *Attorney, Agent, or Firm* — F. Chau & Associates, LLC

(57) ABSTRACT

A display apparatus includes a display panel bendable in a bending direction about a bending axis, pad units disposed on one side of the display panel and arranged in the bendable direction, printed circuit boards disposed below the display panel, and flexible printed circuit boards configured to connect the display panel to the printed circuit boards. The printed circuit boards are bendable in the bending direction about the bending axis, are arranged in the bendable direction, and extend in the bendable direction. Each of the flexible printed circuit boards has a first end connected to the display panel and a second end connected to one of the printed circuit boards. A second distance between the second ends of two of the flexible printed circuit boards respectively connected to two adjacent printed circuit boards is greater than a first distance between the first ends of the two flexible printed circuit boards.

30 Claims, 16 Drawing Sheets

(51) Int. Cl.
 *H05K 1/18* (2006.01)
 *H05K 3/36* (2006.01)
 *F21V 8/00* (2006.01)

(52) U.S. Cl.
 CPC . *H05K 2201/056* (2013.01); *H05K 2201/058* (2013.01); *H05K 2201/10136* (2013.01); *H05K 2201/10484* (2013.01)

(56) References Cited

U.S. PATENT DOCUMENTS

| | | |
|---|---|---|
| 2014/0085587 A1 | 3/2014 | Liao et al. |
| 2015/0245488 A1 | 8/2015 | Jang et al. |
| 2016/0117041 A1* | 4/2016 | Lee ........................ G06F 3/0416 345/173 |
| 2016/0324013 A1* | 11/2016 | Lee ........................ G06F 1/16 |
| 2017/0139249 A1 | 5/2017 | Moon et al. |
| 2019/0187506 A1 | 6/2019 | Yun et al. |

FOREIGN PATENT DOCUMENTS

| | | |
|---|---|---|
| KR | 1020150111545 | 10/2015 |
| KR | 1020160028042 | 3/2016 |
| KR | 10-1658434 | 9/2016 |
| KR | 10-2019-0074330 | 6/2019 |

* cited by examiner

DISPLAY APPARATUS AND METHOD FOR MANUFACTURING THE SAME

CROSS-REFERENCE TO RELATED APPLICATIONS

This application claims priority under 35 U.S.C. § 119 to Korean Patent Application No. 10-2018-0078996, filed on Jul. 6, 2018, the disclosure of which is incorporated by reference herein in its entirety.

TECHNICAL FIELD

Exemplary embodiments of the present disclosure relate to a display apparatus, and more particularly, to a display apparatus having improved durability and reliability.

DISCUSSION OF THE RELATED ART

A display apparatus may include a display panel and a backlight unit providing light to the display panel. The backlight unit may include a light source and a light guide plate. Light generated from the light source is guided to the inside of the light guide plate and then provided to the display panel.

SUMMARY

Exemplary embodiments of the present disclosure provide a display apparatus having improved durability.

According to an exemplary embodiment, a display apparatus includes a display panel bendable in a bending direction about a bending axis, and a first pad unit and a second pad unit disposed on one side of the display panel. The first and second pad units extend in the bending direction and are arranged in the bending direction. The display apparatus further includes a curved member disposed below the display panel, a first printed circuit board (PCB) and a second PCB fixed to a rear surface of the curved member and spaced apart from each other in the bending direction, and a first flexible printed circuit board (FPCB) including a plurality of first flexible boards, each of which has a first end connected to the first pad unit and a second end connected to the first PCB. The display apparatus further includes a second FPCB including a plurality of second flexible boards, each of which has a first end connected to the second pad unit and a second end connected to the second PCB. The first flexible board closest to the second pad unit is defined as a first outermost flexible board, and the second flexible board closest to the first pad unit is defined as a second outermost flexible board. A first distance defined as a distance between the first end of the first outermost flexible board and the first end of the second outermost flexible board is less than a second distance defined as a distance between the second end of the first outermost flexible board and the second end of the second outermost flexible board.

In an exemplary embodiment, a rigidity of the curved member is greater than a rigidity of the display panel.

In an exemplary embodiment, the curved member includes at least one of a light guide plate, an optical sheet, a mold frame, or a bottom chassis.

In an exemplary embodiment, the first and second PCBs are bendable in the bending direction about the bending axis.

In an exemplary embodiment, as the first flexible boards are disposed further away from a center of the first PCB, a tilted angle of each of the first flexible boards from a normal direction at a point on the display panel at which each of the first flexible boards is connected to the display panel increases. Further, as the second flexible boards are disposed further away from a center of the second PCB, a tilted angle of each of the second flexible boards from a normal direction at a point on the display panel at which each of the second flexible boards is connected to the display panel increases.

In an exemplary embodiment, a length of each of the first flexible boards increases as the first flexible boards are disposed further away from the center of the first PCB, and a length of each of the second flexible boards increases as the second flexible boards are disposed further away from the center of the second PCB.

In an exemplary embodiment, the display apparatus further includes a plurality of first driving chips mounted in a one-to-one correspondence with the first flexible boards, and a plurality of second driving chips mounted in a one-to-one correspondence with the second flexible boards. Extending directions of each of the first driving chips and each of the second driving chips are parallel to the bending direction.

In an exemplary embodiment, when the display panel is bent, each of the first outermost flexible board and the second outermost flexible board has a rectangular shape.

In an exemplary embodiment, when the display panel is bent, lengths of each of the first flexible boards and each of the second flexible boards are the same.

In an exemplary embodiment, the display apparatus further includes a plurality of first driving chips mounted in a one-to-one correspondence with the first flexible boards, and a plurality of second driving chips mounted in a one-to-one correspondence with the second flexible boards. On a cross-section, a virtual line including central points of a distance between one surface of the display panel and one surface of the first PCB and central points of a distance between the one surface of the display panel and one surface of the second PCB is defined as a bending line, and extending directions of each of the first driving chips and each of the second driving chips are parallel to the bending line.

In an exemplary embodiment, when a curvature radius of the display panel is defined as R, a thickness of the curved member is defined as D, and a distance between a center of the first PCB and a center of the second PCB is defined as W, a minimum value of a difference between the first distance and the second distance ranges from $9*D*W/20*R$ to $11*D*W/20*R$.

According to an exemplary embodiment, a method for manufacturing a display apparatus includes bonding a display panel and each of a plurality of printed circuit boards to a plurality of flexible printed circuit boards, disposing the display panel on an upper portion of a bottom part of a curved member, and fixing each of the printed circuit boards to a rear surface of the bottom part of the curved member. The curved member is bendable in a bending direction about a bending axis, and a distance between the printed circuit boards adjacent to each other after the printed circuit boards are fixed is greater than a distance between the printed circuit boards adjacent to each other before the printed circuit boards are fixed.

In an exemplary embodiment, a pad unit is disposed on one side of the display panel in a first direction parallel to the bending axis, the printed circuit boards are arranged in a second direction crossing the first direction and extend in the second direction, and the flexible printed circuit boards connect the pad unit to the printed circuit boards.

In an exemplary embodiment, a rigidity of the curved member is greater than a rigidity of the display panel.

In an exemplary embodiment, the curved member includes at least one of a light guide plate, an optical sheet, a mold frame, or a bottom chassis.

In an exemplary embodiment, the display panel is bent in a bending direction about the bending axis as the display panel is disposed on the curved member and as each of the printed circuit boards is fixed to a rear surface of the bottom part of the curved member.

In an exemplary embodiment, each of the printed circuit boards is bent in a bending direction about the bending axis as the display panel is disposed on the curved member.

In an exemplary embodiment, as the display panel is bent, a stress applied to at least one flexible printed circuit board closest to a center of each of the printed circuit boards is reduced.

In an exemplary embodiment, as the display panel is bent, the stress applied to each of the flexible printed circuit boards increases as the flexible printed circuit boards are disposed further away from the center of each of the printed circuit boards.

In an exemplary embodiment, fixing each of the printed circuit boards includes forming alignment marks on the rear surface of the bottom part of the curved member, and fixing the printed circuit boards to the curved member such that the printed circuit boards correspond to the alignment marks.

In an exemplary embodiment, when a curvature radius of the display panel is defined as R, a thickness of the curved member is defined as D, and a distance between a center of a first printed circuit board and a center of a second printed circuit board adjacent to the first printed circuit board is defined as W, a minimum value of a difference of a distance between the first and second printed circuit boards after the first and second printed circuit boards are fixed and a distance between the first and second printed circuit boards before the first and second printed circuit boards are fixed ranges from $9*D*W/20*R$ to $11*D*W/20*R$.

In an exemplary embodiment, when bonding the display panel and each of the printed circuit boards, the flexible printed circuit boards extend in the first direction and are disposed in parallel to the first direction, and when fixing the printed circuit boards, as the display panel is bent, the printed circuit boards are fixed to the curved member in an order of the flexible printed circuit boards disposed further away from a center of each of the printed circuit boards, and each of the flexible printed circuit boards increases in extending length.

In an exemplary embodiment, bonding the display panel and each of the printed circuit boards includes bonding a plurality of driving chips to the flexible printed circuit boards in a one-to-one correspondence with each other.

In an exemplary embodiment, bonding the display panel and each of the printed circuit boards includes bonding the flexible printed circuit boards to the display panel and each of the printed circuit boards in an order of the flexible printed circuit boards disposed further away from a center of each of the printed circuit boards. An angle between an extending direction of one end of each of the flexible printed circuit boards and the first direction increases. When fixing the printed circuit boards, as the display panel is bent, the printed circuit boards are fixed to the curved member such that the extending direction of each of the flexible printed circuit boards is parallel to a normal direction at a point on the display panel at which each of the flexible printed circuit boards is connected to the display panel.

In an exemplary embodiment, bonding the display panel and each of the printed circuit boards includes bonding a plurality of driving chips to the flexible printed circuit boards in a one-to-one correspondence with the flexible printed circuit boards. Each of the driving chips is bonded in the order of the flexible printed circuit boards disposed further away from the center of each of the printed circuit boards. An angle between a normal direction of the extending direction of the flexible printed circuit boards and an extending direction of the corresponding driving chips increases.

In an exemplary embodiment, when fixing the printed circuit boards to the curved member, the extending direction of each of the driving chips is perpendicular to the normal direction of the extending direction of the flexible printed circuit boards.

According to an exemplary embodiment, a method for manufacturing a display apparatus includes bonding a display panel and each of a plurality of printed circuit boards to a plurality of flexible printed circuit boards, disposing the display panel on an upper portion of a bottom part of a curved member, and fixing each of the printed circuit boards to a rear surface of the bottom part of the curved member. The curved member is bendable in a bending direction about a bending axis. When fixing the printed circuit boards, as the display panel is bent, the printed circuit boards are fixed such that deformation of the flexible printed circuit boards is successively reduced as the flexible printed circuit boards are disposed closer to a center of each of the printed circuit boards.

According to an exemplary embodiment, a display apparatus includes a display panel bendable in a bending direction about a bending axis, a plurality of pad units disposed on one side of the display panel and arranged in the bendable direction, and a plurality of printed circuit boards disposed below the display panel. The printed circuit boards are bendable in the bending direction about the bending axis, are arranged in the bendable direction, and extend in the bendable direction. The display apparatus further includes a plurality of flexible printed circuit boards configured to connect the display panel to the printed circuit boards. Each of the flexible printed circuit boards has a first end connected to the display panel and a second end connected to one of the printed circuit boards. A second distance between the second ends of two of the flexible printed circuit boards respectively connected to two adjacent printed circuit boards is greater than a first distance between the first ends of the two flexible printed circuit boards.

In an exemplary embodiment, the display apparatus further includes a curved member disposed between the display panel and each of the printed circuit boards. The printed circuit boards are fixed to a rear surface of the curved member.

In an exemplary embodiment, when a curvature radius of the display panel is defined as R, a thickness of the curved member is defined as D, and a distance between a center of each of the two adjacent printed circuit boards is defined as W, a minimum value of a difference between the first distance and the second distance ranges from $9*D*W/20*R$ to $11*D*W/20*R$.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION

Figure 1:
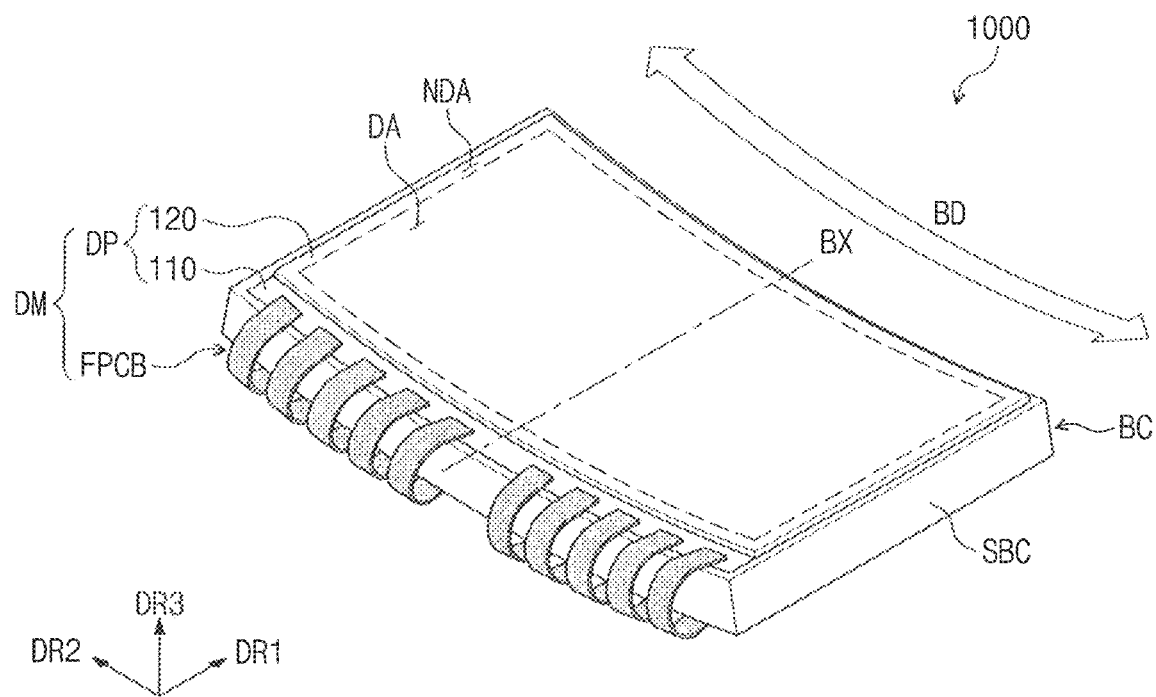
FIG. 1 is a perspective view of a display apparatus according to an exemplary embodiment of the inventive concept.

Exemplary embodiments of the present inventive concept will be described more fully hereinafter with reference to the accompanying drawings Like reference numerals may refer to like elements throughout the accompanying drawings.

It will be understood that when a component such as, for example, a layer is referred to as being "on" another layer or substrate, it can be directly on the other layer or substrate, or intervening layers may also be present.

Spatially relative terms, such as "below", "beneath", "lower", "above", "upper" and the like, may be used herein for ease of description to describe one element or feature's relationship to another element(s) or feature(s) as illustrated in the figures. The spatially relative terms should be understood as terms which include different directions of configurative elements in addition to directions illustrated in the figures when using or operating the inventive concept.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

Figure 2:
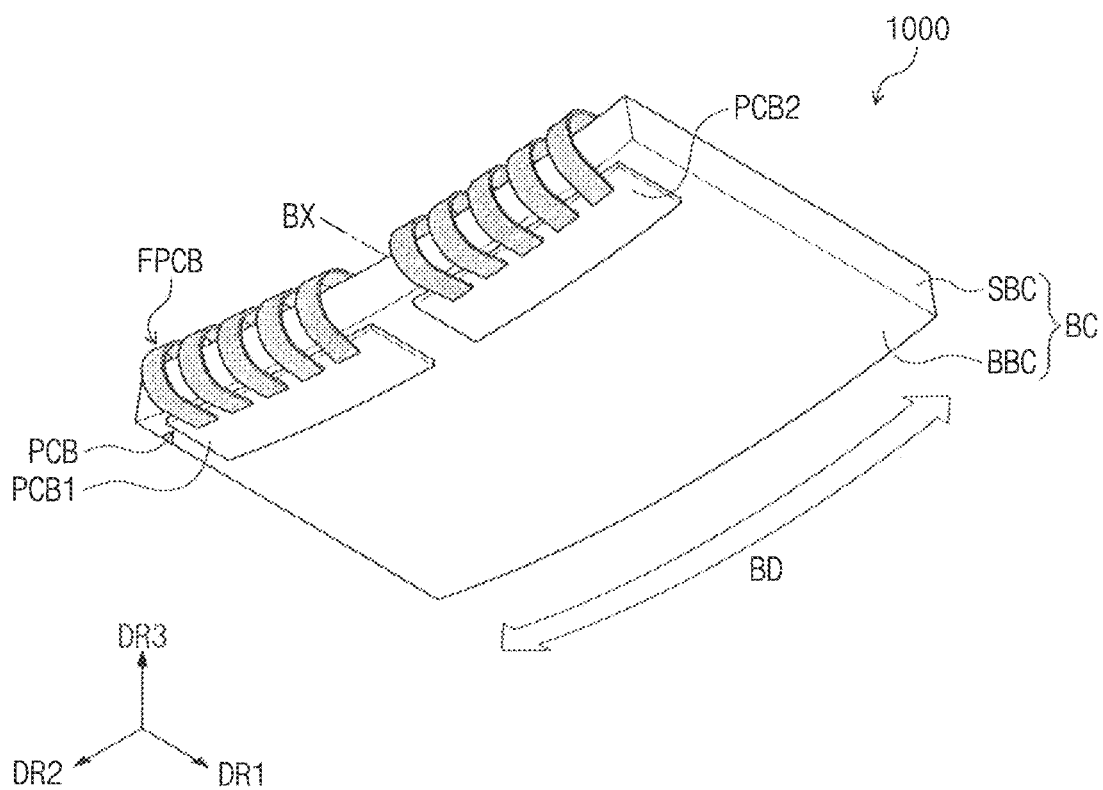
FIG. 2 is a bottom view of the display apparatus of FIG. 1.
Figure 3:
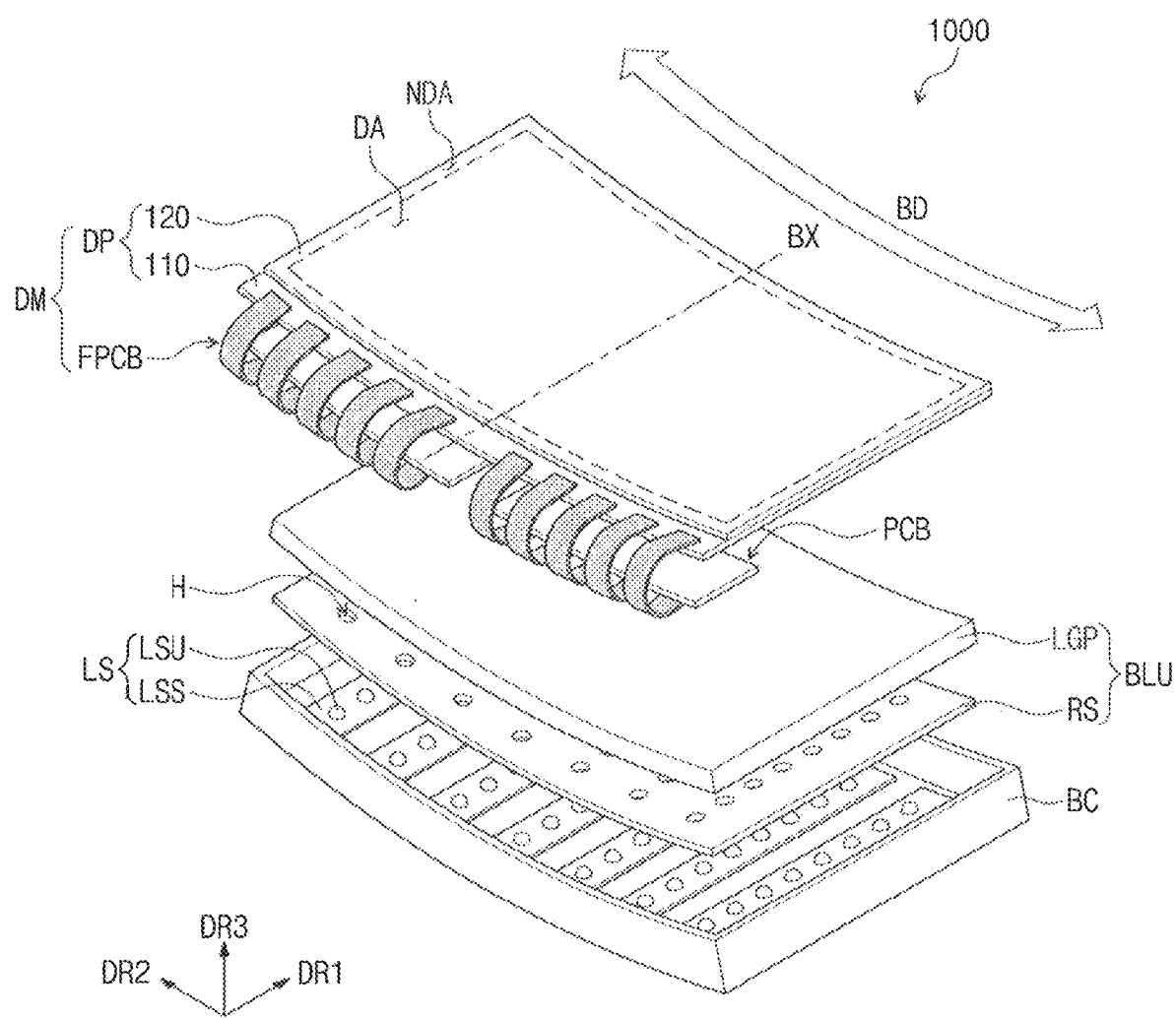
FIG. 3 is an exploded perspective view of the display apparatus of FIG. 1.

FIG. 1 is a perspective view of a display apparatus according to an exemplary embodiment of the inventive concept. FIG. 2 is a bottom view of the display apparatus of FIG. 1. FIG. 3 is an exploded perspective view of the display apparatus of FIG. 1.

Referring to FIGS. 1 to 3, a display apparatus 1000 according to an exemplary embodiment of the inventive concept has a rectangular shape with a short side extending in a first direction DR1 and a long side extending in a second direction DR2. The short side extending in the first direction DR1 is relatively shorter than the long side extending in the second direction DR2. However, the display apparatus 1000 is not limited thereto, and may have various shapes.

In the exemplary embodiment of FIGS. 1 to 3, a direction in which an image is provided from the display apparatus 1000 may be defined as an upward direction, and a direction opposite to the upward direction may be defined as a downward direction. The upward and downward directions are parallel to a third direction DR3 that is defined in a normal direction of a plane defined by the first and second directions DR1 and DR2. The third direction DR3 may be a reference direction for dividing front and rear surfaces of components that will be described below. However, the upward direction and the downward direction may be a relative concept, and thus may be changed in different directions.

The display apparatus 1000 may have a shape that is convexly bent in the downward direction from a plane defined by the first direction DR1 and the second direction DR2. For example, the display apparatus 1000 is bent in a bending direction BD that is recessed in the third direction DR3 with respect to a virtual bending axis BX that is parallel to the first direction DR1. That is, the display apparatus 1000 is bent in a direction surrounding a bending axis BX. For example, a display panel DP of the display apparatus 1000 is bent in the bending direction BD about the virtual bending axis BX. Thus, the display apparatus 1000 has a straight line in the first direction DR1 and a curve on a plane defined in the second direction DR2 and the third direction DR3.

The display apparatus 1000 includes a display module DM, a backlight unit BLU, and an accommodation member BC. The display apparatus 1000 may include a window disposed at the uppermost portion of the display apparatus 1000. The window may allow for the transmission of light provided from the display module DM, and may protect the display module DM.

The display module DM includes the display panel DP, a plurality of printed circuit boards PCB, and a plurality of flexible printed circuit boards FPCB.

The display panel DP includes at least one display surface. For example, a display area DA in which an image is displayed and a non-display area NDA in which an image is not displayed may be disposed on the plane of the display panel DP. For example, the display panel DP may display an image on the concave display surface.

The display area DA is defined on a center of the display panel DP on the plane, and the non-display area NDA has a frame shape surrounding the display area DA. However, the inventive concept is not limited to the shapes of the display area DA and the non-display area NDA shown in FIGS. 1 to 3. For example, according to an exemplary embodiment of the inventive concept, a plurality of display areas DA may be included on the plane of the display panel DP, and/or the non-display area NDA may be included on only one edge of the display surface (e.g., the non-display area NDA may not surround the display area DA).

Herein, exemplary embodiments in which the display panel DP is a liquid crystal display (LCD) panel will be exemplarily described. However, the inventive concept is not limited thereto. For example, according to exemplary embodiments of the inventive concept, the display panel DP may be a different kind of display panel such as an organic electro luminescence display panel, an electrowetting display panel, and a nano-crystal display panel. When the display panel DP is the organic electro luminescence display panel, since the organic electro luminescence display panel generates light by itself to display an image, the backlight unit BLU may be omitted in the display apparatus 1000.

The display panel DP includes a first substrate 110, a second substrate 120 facing the first substrate 110, and a liquid crystal layer disposed between the first substrate 110 and the second substrate 120.

A plurality of pad units (see FIG. 5) may be disposed in the non-display area NDA. In an exemplary embodiment, the pad units are disposed at one side of the first substrate 110 in the first direction DR1. The pad units will be described in more detail with reference to FIGS. 5 and 6.

In an exemplary embodiment of the inventive concept, the printed circuit board PCB is provided in a plurality. The printed circuit boards PCB are disposed below the display panel DP, are arranged in the bending direction BD, and extend along the long side of the display apparatus 1000. Each of the printed circuit boards PCB may have a shape that is convexly bent in the downward direction from the plane defined by the first direction DR1 and the second direction DR2. The printed circuit boards PCB overlap the pad units of the display panel DP on the plane.

The printed circuit boards PCB include a first printed circuit board PCB1 and a second printed circuit board PCB2, as shown in FIG. 2. Although two printed circuit boards PCB are illustrated in FIG. 2, the inventive concept is not limited thereto. For example, according to an exemplary embodiment of the inventive concept, three or more printed circuit boards PCB may be disposed below the display panel DP.

The flexible printed circuit boards FPCB connect the printed circuit boards PCB to the display panel DP. The flexible printed circuit boards FPCB may be bent from the display panel DP, which is flexible, to each of the printed circuit boards PCB disposed below the display panel DP. In an exemplary embodiment, each of the flexible printed circuit boards FPCB may be provided in the form of a tape carrier package (TCP).

According to an exemplary embodiment, after the display panel DP and the printed circuit board PCB are connected to each other by the flexible printed circuit boards FPCB, the flexible printed circuit boards FPCB may be bent downward to be disposed below the display panel DP of the printed circuit board PCB.

A configuration of the display module DM will be described below in more detail with reference to FIGS. 4 to 10.

The backlight unit BLU may provide light to the display panel DP and may be disposed below the display panel DP.

The backlight unit BLU according to an exemplary embodiment of the inventive concept may be a direct-type backlight unit BLU. However, the inventive concept is not limited thereto. For example, a backlight unit BLU according to an exemplary embodiment of the inventive concept may be an edge-type backlight unit.

The backlight unit BLU includes a light source LS, a light guide plate LGP, and a reflection sheet RS.

The light source LS generates light. The light source LS includes a plurality of light source units LSU and a plurality of light source substrates LSS. Each of the light source substrates LSS has a rectangular plate shape extending in the first direction DR1. The light source substrates LSS may be arranged in the second direction DR2. However, the inventive concept is not limited thereto.

The light source units LSU may be mounted on each of the light source substrates LSS. The light source units LSU may be arranged in the extension direction of the light source substrates LSS.

The light guide plate LGP is disposed on the light source LS. The light guide plate LGP may have a shape that is convexly bent downward from the plane defined by the first direction DR1 and the second direction DR2.

The light guide plate LGP may receive light from the light source LS, and may guide the received light to the display panel DP. The light guide plate LGP may include a material having high light transmittance in a visible light region. The material forming the light guide plate LGP may include, for example, at least one of polyamide (PA), polymethyl methacrylate (PMMA), methyl methacrylate-styrene (MS), or polycarbonate (PC). However, the material of the light guide plate LGP is not limited thereto. In an exemplary embodiment of the inventive concept, the light guide plate LGP may be omitted. In an exemplary embodiment of the inventive concept, an optical sheet that diffuses received light to provide the light in an upward direction may be replaced with the light guide plate LGP.

The reflection sheet RS is disposed between the light source LS and the light guide plate LGP. The reflection sheet RS may have a shape that is convexly bent in the downward direction from the plane defined by the first direction DR1 and the second direction DR2.

The reflection sheet RS reflects light leaking from the light guide plate LGP so that the leaking light is incident again into the light guide plate LGP. A plurality of holes H may be defined in the reflection sheet RS. The light source units LSU may be inserted into the holes H.

The backlight unit BLU according to an exemplary embodiment of the inventive concept may further include a mold frame. The mold frame may be provided on an edge of the display panel DP and may support the display panel DP at a lower portion of the display panel DP.

The accommodation member BC may be disposed below the light source LS and may accommodate the display panel DP and the backlight unit BLU. In an exemplary embodiment, the accommodation member BC may be a bottom chassis. The accommodation member BC may have a shape that is convexly bent in the downward direction from the plane defined by the first direction DR1 and the second direction DR2.

The accommodation member BC includes a bottom part BBC and a plurality of sidewalls SBC connected to the bottom part BBC, as shown in FIG. 2. The light source LS may be disposed on the accommodation member BC. The accommodation member BC may be made of a metal material having a rigidity.

According to an exemplary embodiment of the inventive concept, a curved member is disposed between the display panel DP and the printed circuit boards PCB. The curved member has a rigidity greater than that of the display panel DP. For example, the curved member may be less bendable than the display panel DP. In an exemplary embodiment of the inventive concept, the curved member may be at least one of the light guide plate LGP, the optical sheet, the mold frame, or the accommodation member BC. For example, when at least one of the light guide plate LGP, the optical sheet, the mold frame, or the accommodation member BC has a rigidity greater than that of the display panel DP, at least one of the light guide plate LGP, the optical sheet, the mold frame, or the accommodation member BC may be disposed between the display panel DP and the printed circuit boards PCB to function as the curved member.

In an exemplary embodiment, the bottom chassis (e.g., the accommodation member BC) accommodating the light guide plate LGP, the reflection sheet RS, and the light source LS may function as the curved member. For example, the display panel DP may be disposed on an upper portion of the bottom part BBC of the bottom chassis (e.g., the accommodation member BC), and the printed circuit boards PCB may be fixed to a lower portion of the bottom part BBC of the bottom chassis (e.g., the accommodation member BC). That is, the bottom chassis (e.g., the accommodation member BC) accommodating the backlight unit BLU may be disposed between the display panel DP and the printed circuit boards PCB. In this case, the flexible printed circuit boards FPCB may be bent to surround one sidewall SBC of the sidewalls SBC of the bottom chassis (e.g. the accommodation member BC).

As described above, each of the display panel DP and the printed circuit board PCB, which are connected to each other, may have a bent shape by the flexible printed circuit board FPCB. Each of the display panel DP and the printed circuit board PCB may be bent by an external pressure. For example, each of the display panel DP and the printed circuit boards PCB may be bent to correspond to a shape of the curved member having a relatively large rigidity when the display apparatus 1000 is assembled.

Figure 4:
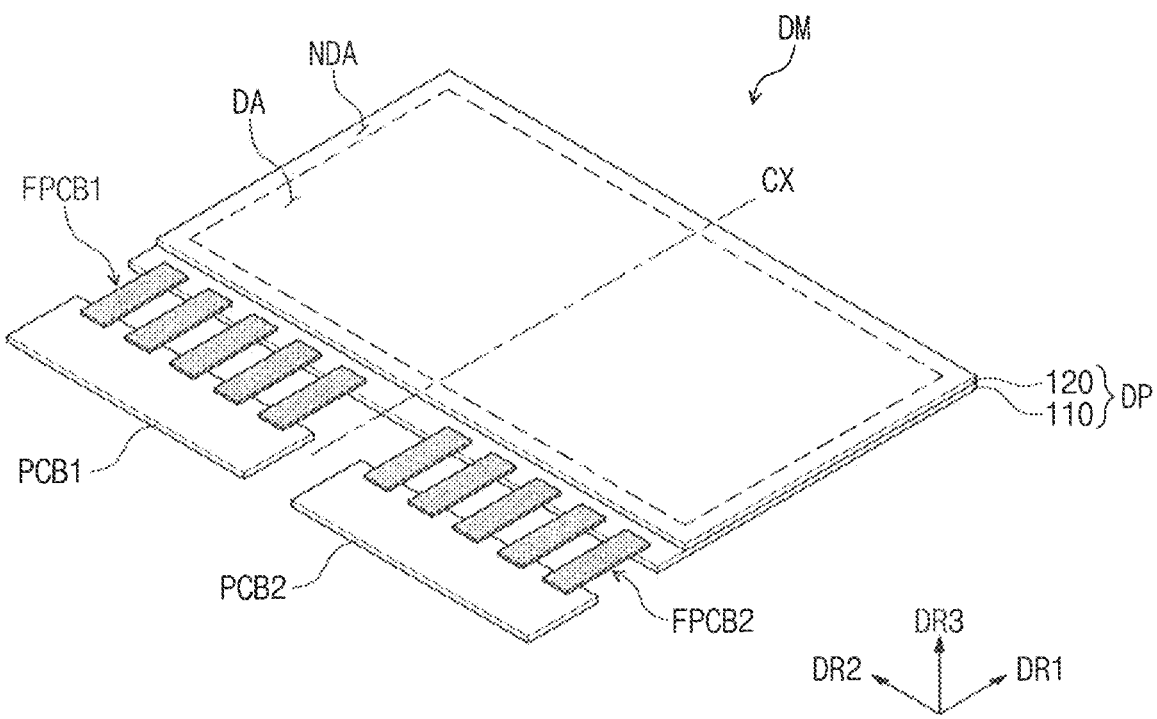
FIG. 4 is a perspective view of a display module before being assembled according to an exemplary embodiment of the inventive concept.
Figure 5:
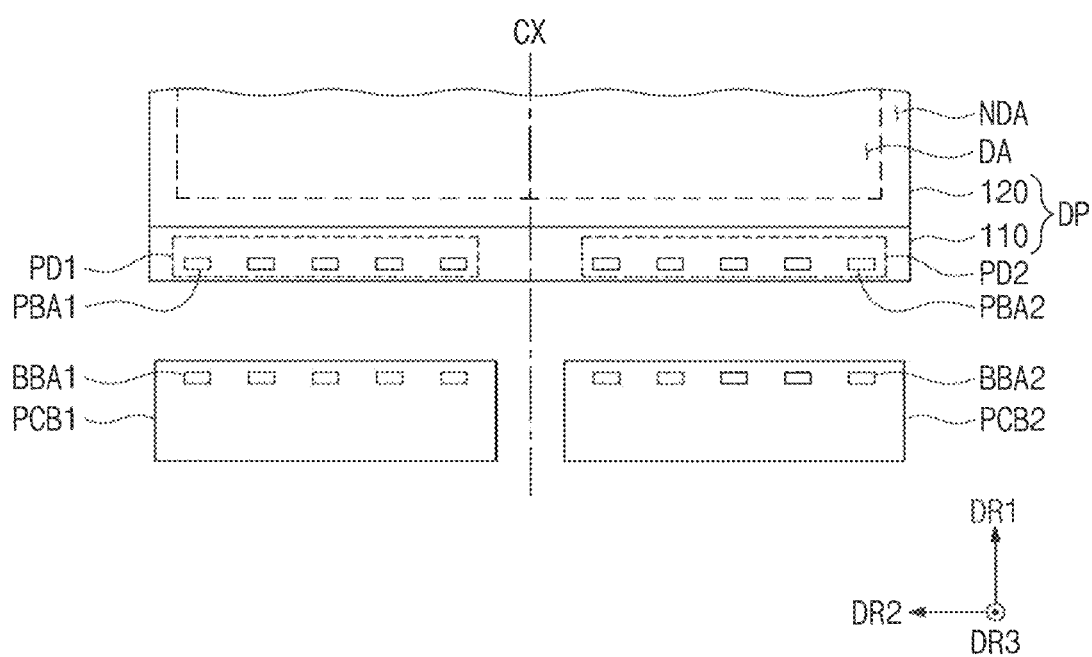
FIG. 5 is a plan view illustrating pad units of a display panel and printed circuit boards according to an exemplary embodiment of the inventive concept.
Figure 6:
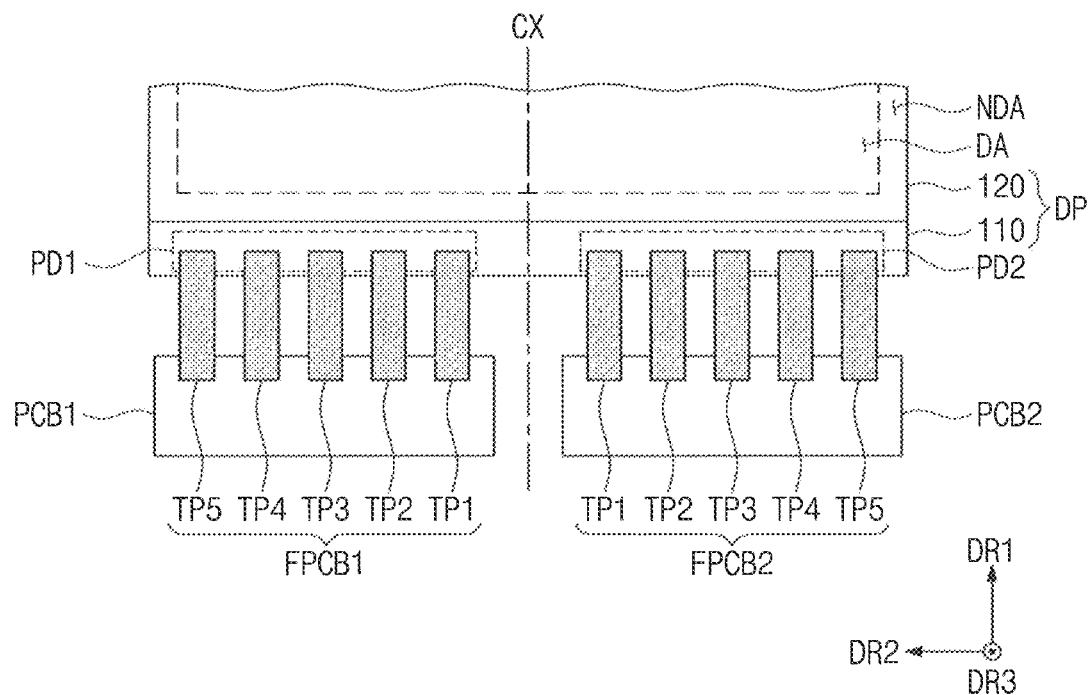
FIG. 6 is a plan view of the display module of FIG. 4 after bonding is completely performed on flexible printed circuit boards.

FIG. 4 is a perspective view of a display module before being assembled according to an exemplary embodiment of the inventive concept. FIG. 5 is a plan view of the pad units of the display panel and the printed circuit boards according to an exemplary embodiment of the inventive concept. FIG. 6 is a plan view of the display module of FIG. 4 after bonding is completely performed on the flexible printed circuit boards.

Referring to FIGS. 4 to 6, the display module DM before assembly may have a flat plate shape, as shown in FIG. 4. For example, the display module DM before assembly may be parallel to the plane defined by the first direction DR1 and the second direction DR2.

A plurality of pad units PD1 and PD2 (see FIG. 5) may be included in the non-display area NDA of the display panel DP. In an exemplary embodiment, the pad units PD1 and PD2 are included at one side of the first substrate 110 in the first direction DR1. The first and second pad units PD1 and PD2 extend in the bending direction BD and are arranged in the bending direction BD. For example, the first and second pad units PD1 and PD2 extend lengthwise in the bending direction BD, and the first and second pad units PD1 and PD2 are adjacent to each other in the bending direction BD.

For example, in an exemplary embodiment, the short side of the first substrate 110 is longer than the short side of the second substrate 120, as shown in FIG. 4. For example, the first substrate 110 has a size that is relatively greater than that of the second substrate 120. The second substrate 120 covers a portion of the first substrate 110 in the first direction DR1, without covering an entirety of the first substrate 110, as shown in FIG. 4. For example, as shown in FIG. 4, the second substrate 120 covers a portion of the first substrate 110 in the first direction DR1, and the plurality of flexible printed circuit boards FPCB are connected to the remaining portion of the first substrate 110 that is not covered by the second substrate 120. An area on which the first substrate 110 and the second substrate 120 overlap each other includes the display area DA. The pad units PD1 and PD2 are disposed on the remaining portion of the first substrate 110 that is not overlapped by the second substrate 120, as shown in FIGS. 5 and 6.

The pad units PD1 and PD2 include a first pad unit PD1 and a second pad unit PD2.

The first pad unit PD1 is disposed at one side of the non-display area NDA in the second direction DR2, and the second pad unit PD2 is disposed at the other side of the non-display area NDA in the second direction DR2 with respect to a central line CX that is parallel to the first direction DR1 and passing through the display panel DP. The first pad unit PD1 and the second pad unit PD2 are arranged to be spaced part from each other in the second direction DR2.

The first pad unit PD1 includes a plurality of first panel bonding areas PBA1. The first panel bonding areas PBA1 are arranged in the second direction DR2.

The second pad unit PD2 includes a plurality of second panel bonding areas PBA2. The second panel bonding areas PBA2 are arranged in the second direction DR2.

The first and second panel bonding areas PBA1 and PBA2 may be arranged in the second direction DR2 before the display panel DP is bent. The first and second panel bonding areas PBA1 and PBA2 of the bent display panel DP may be arranged in the bent direction BD (see FIGS. 1 to 3) after the display apparatus 1000 is assembled.

Although five first panel bonding areas PBA1 and five second panel bonding areas PBA2 are illustrated in FIG. 5, the inventive concept is not limited thereto. For example, in an exemplary embodiment, even-numbered first and second panel bonding areas PBA1 and PBA2 may be included on the display panel DP, and more or less than five first panel bonding areas PBA1 and five second panel bonding areas PBA2 may be included on the display panel DP.

In an exemplary embodiment, each of the first panel bonding areas PBA1 and the second panel bonding areas PBA2 may have a rectangular shape. For example, each of the first panel bonding areas PBA1 and the second panel bonding areas PBA2 may have a rectangular shape having a long side parallel to the second direction DR2. However, the inventive concept is not limited thereto.

The display panel DP may include a plurality of pad electrodes disposed on each of the first and second panel bonding areas PBA1 and PBA2.

The first printed circuit board PCB1 is disposed at one side in the second direction DR2 with respect to the central line CX. The second printed circuit board PCB2 is disposed at the other side in the second direction DR2 with respect to the central line CX.

The first printed circuit board PCB1 includes a plurality of first board bonding areas BBA1 included on one surface of the first printed circuit board PCB1. The first board bonding areas BBA1 are arranged in the second direction DR2. For example, the first board bonding areas BBA1 are disposed adjacent to each other in the second direction DR2.

The second printed circuit board PCB2 includes a plurality of second board bonding areas BBA2 included on one surface of the second printed circuit board PCB2. The second board bonding areas BBA2 are arranged in the second direction DR2. For example, the second board bonding areas BBA2 are disposed adjacent to each other in the second direction DR2.

The first and second board bonding areas BBA1 and BBA2 may be arranged in the second direction DR2 before the printed circuit boards PCB1 and PCB2 are bent. The first and second board bonding areas BBA1 and BBA2 of the bent printed circuit boards PCB1 and PCB2 may be arranged in the bent direction BD (see FIGS. 1 to 3) after the display apparatus 1000 is assembled.

Although five first board bonding areas BBA1 and five second board bonding areas BBA2 are illustrated in FIG. 5, the inventive concept is not limited thereto. For example, in an exemplary embodiment, even-numbered first and second board bonding areas BBA1 and BBA2 may be included on surfaces of the printed circuit boards PCB1 and PCB2, and more or less than five first board bonding areas BBA1 and five second board bonding areas BBA2 may be included on surfaces of the printed circuit boards PCB1 and PCB2.

In an exemplary embodiment, each of the first board bonding areas BBA1 and the second board bonding areas BBA2 may have a rectangular shape. For example, in an exemplary embodiment, each of the first board bonding areas BBA1 and the second board bonding areas BBA2 may have a rectangular shape having a long side parallel to the second direction DR2. However, the inventive concept is not limited thereto.

The printed circuit boards PCB1 and PCB2 may include a plurality of pad electrodes disposed on each of the first and second board bonding areas BBA1 and BBA2.

The flexible printed circuit boards FPCB (see FIG. 3) electrically connect the display panel DP to the printed circuit boards PCB1 and PCB2. The flexible printed circuit boards FPCB include a first flexible printed circuit board FPCB1 and a second flexible printed circuit board FPCB2 (see FIG. 4), each of which includes a plurality of flexible boards TP, as described further below. The first and second flexible printed circuit boards FPCB1 and FPCB2 are arranged in the second direction DR2. For example, the first and second flexible printed circuit boards FPCB1 and FPCB2 are disposed adjacent to each other in the second direction DR2

The flexible printed circuit boards FPCB1 and FPCB2 are arranged in the second direction DR2 before the display module DM is bent. The flexible printed circuit boards FPCB of the bent display module DM may be arranged in the bending direction BD (see FIGS. 1 to 3) after the display apparatus 1000 is assembled.

The first flexible printed circuit board FPCB1 connects the display panel DP to the first printed circuit board PCB1. The first flexible printed circuit board FPCB1 includes flexible boards TP provided to correspond to the number of first panel bonding areas PBA1 and the number of first board bonding areas BBA1. For example, each of the flexible boards TP of the first flexible printed circuit board FPCB1 has one end connected to one of the first panel bonding areas PBA1 of the display panel DP and the other end connected to one of the first board bonding areas BBA1 of the first printed circuit board PCB1.

The first flexible printed circuit board FPCB1 includes first to fifth flexible boards TP1 to TP5, as shown in FIG. 6. Herein, the flexible boards TP1 to TP5 may each be generally referred to as a flexible board TP, and the flexible boards TP may also be referred to as flexible printed circuit boards. The first to fifth flexible boards TP1 to TP5 are sequentially arranged on the first substrate 110 in the second direction DR2 in the area that is not overlapped by the second substrate 120. The first flexible board TP1 of the first to fifth flexible boards TP1 to TP5 is closest to the central line CX. For example, the first flexible board TP1 of the first to fifth flexible boards TP1 to TP5 of the first flexible printed circuit board FPCB1 is closest to the second pad unit PD2. The first flexible board TP1 of the first flexible printed circuit board FPCB1 is defined as the first outermost flexible board.

The second flexible printed circuit board FPCB2 connect the display panel DP to the second printed circuit board PCB2. The flexible boards TP1 to TP5 of the second flexible printed circuit board FPCB2 are provided to correspond to the number of second panel bonding areas PBA2 and the number of second board bonding areas BBA2. For example, each of the flexible boards TP1 to TP5 of the second flexible printed circuit board FPCB2 has one end connected to one of the second panel bonding areas PBA2 of the display panel DP and the other end connected to one of the second board bonding areas BBA2 of the second printed circuit board PCB2.

The second flexible printed circuit board FPCB2 include first to fifth flexible boards TP1 to TP5, as shown in FIG. 6. The first to fifth flexible boards TP1 to TP5 are sequentially arranged on the first substrate 110 in the second direction DR2 in the area that is not overlapped by the second substrate 120. The first flexible board TP1 of the first to fifth flexible boards TP1 to TP 5 is closest to the central line CX. For example, the first flexible board TP1 of the first to fifth flexible boards TP1 to TP5 of the second flexible printed circuit board FPCB2 is closest to the first pad unit PD1. The first flexible board TP1 of the second flexible printed circuit board FPCB2 is defined as the second outermost flexible board.

In an exemplary embodiment, the first and second flexible printed circuit boards FPCB1 and FPCB2 have the same shape and size before the display module DM is bent. For example, each of the first and second flexible printed circuit boards FPCB1 and FPCB2 may have a rectangular shape extending in the first direction DR1 before the display module DM is bent. The first and second flexible printed circuit boards FPCB1 and FPCB2 may be disposed in parallel to the first direction DR1 before the display module DM is bent. However, after the display apparatus 1000 is completely assembled, each of the first and second flexible printed circuit boards FPCB1 and FPCB2 may be changed in shape, size, and extension direction. Hereinafter, this will be described in more detail with reference to FIGS. 7 and 8.

The display module DM may include a plurality of driving chips mounted on each of the first and second flexible printed circuit boards FPCB1 and FPCB2. Each of the driving chips may have a rectangular shape extending in the second direction DR2. However, the inventive concept is not limited thereto.

Figure 7:
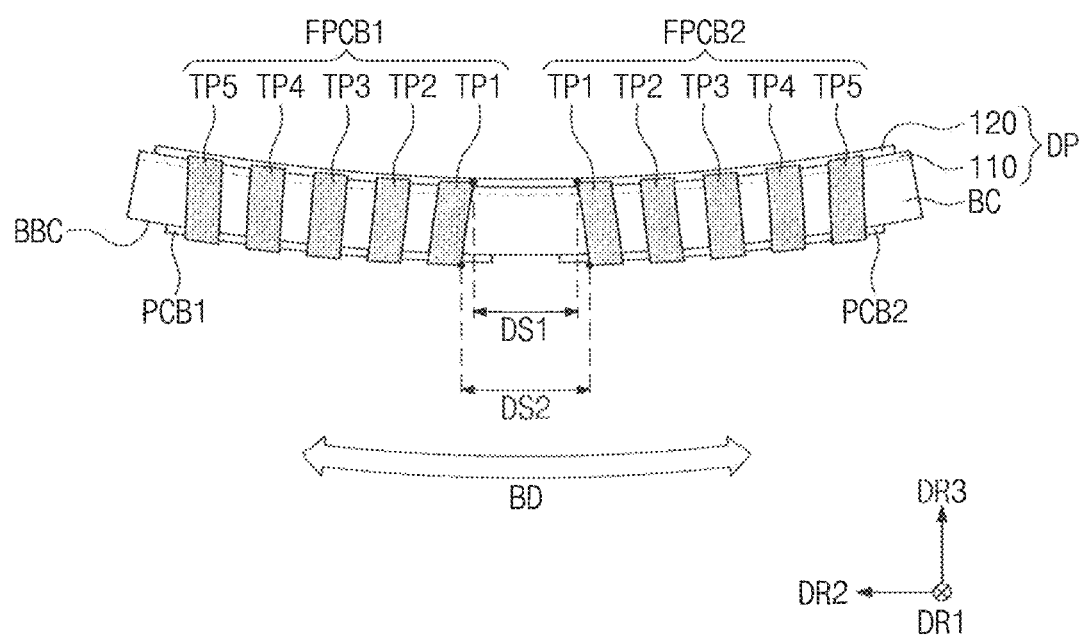
FIG. 7 is a front view of the display apparatus after being completely assembled.
Figure 8:
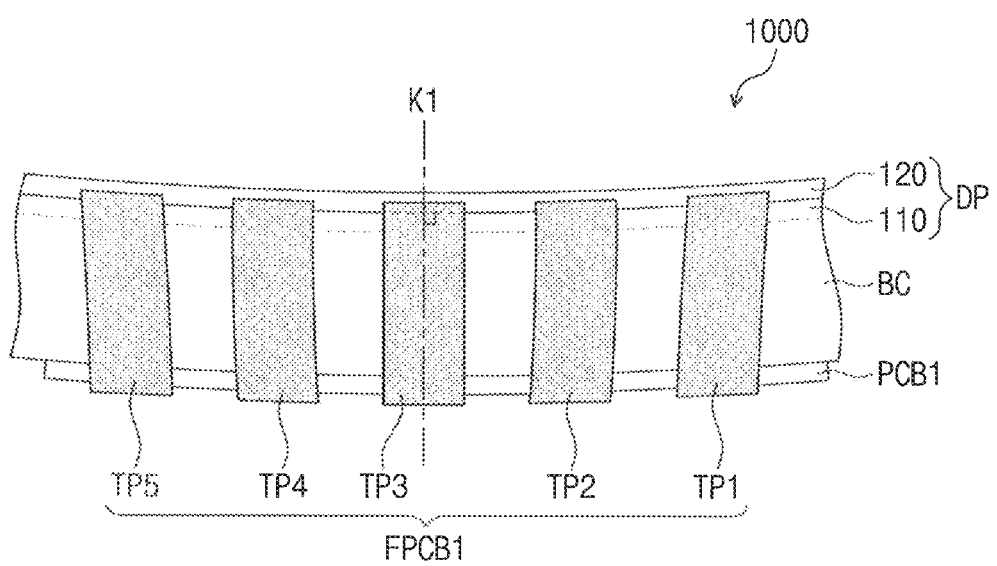
FIG. 8 is an enlarged view of flexible printed circuit boards of FIG. 7.

FIG. 7 is a front view of the display apparatus after being completely assembled. FIG. 8 is an enlarged view of the flexible printed circuit boards of FIG. 7.

In FIG. 7, the first and second flexible printed circuit boards FPCB1 and FPCB2, each of which includes the five flexible boards TP1 to TP5, will be described as an example. Since the first printed circuit board PCB1 and the first flexible printed circuit boards FPCB1, which will be described below, have the same configuration as the second printed circuit board PCB2 and the second flexible printed circuit board FPCB2, for convenience of description, only the first printed circuit board PCB1 and the first flexible printed circuit boards FPCB1 will be described with reference to FIG. 8.

Referring to FIGS. 7 and 8, the display module DM may be bent in the bending direction BD by an external pressure. For example, since the display module DM is fixed to the curved accommodation member BC, the display module DM may be bent on the curved accommodation member BC in a direction in which the bending axis BX (see FIGS. 1 to 3) is surrounded. Since the printed circuit boards PCB1 and PCB2 are fixed to the bottom part BBC of the curved accommodation member BC, the printed circuit boards PCB1 and PCB2 may be bent in the direction in which the bending axis BX (see FIGS. 1 to 3) is surrounded. A curvature radius of the display panel DP and a curvature radius of each of the printed circuit boards PCB1 and PCB2 may be different from each other to correspond to a thickness of the curved accommodation member BC. A difference value therebetween may correspond to the thickness of the curved accommodation member BC.

When the display apparatus 1000 is assembled, stress may be applied to the flexible printed circuit boards FPCB1 and FPCB2 connecting the display panel DP to the printed circuit boards PCB1 and the PCB2 due to the difference in curvature radius of each of the display panel DP and the printed circuit boards PCB1 and PCB2.

According to an exemplary embodiment of the inventive concept, when the display apparatus 1000 is assembled, the printed circuit boards PCB1 and PCB2 may be fixed to specific positions on the rear surface of the bottom part BBC of the curved accommodation member BC to reduce the stress applied to the flexible printed circuit boards FPCB1 and FPCB2. For example, since the display module DM is bent, each of the printed circuit boards PCB1 and PCB2 may be shifted to be fixed in a direction of the outside of the display apparatus 1000. That is, since the display module DM is bent, a distance between the first printed circuit board PCB1 and the second printed circuit board PCB2 may increase.

When the display module DM is completely assembled, a first distance DS1 defined as a distance between one end (e.g., a first end) of the first outermost flexible board TP1 connected to the first printed circuit board PCB1 and one end (e.g., a first end) of the second outermost flexible board TP2 connected to the second printed circuit board PCB2 is less than a second distance DS2 defined as a distance between the other end (e.g., a second end) of the first outermost flexible board TP1 connected to the first printed circuit board PCB1 and the other end (e.g., a second end) of the second outermost flexible board TP2 connected to the second printed circuit board PCB2. A difference between the first distance DS1 and the second distance DS2 may be equal to a shifted distance S (see FIG. 10) of each of the first and second printed circuit boards PCB1 and PCB2.

According to an exemplary embodiment, when the display module DM is completely assembled, as the flexible boards TP of the flexible printed circuit boards FPCB1 and FPCB2 disposed on each of the printed circuit boards PCB1 and PCB2 are disposed further away from a center of each of the printed circuit boards PCB1 and PCB2, the stress applied to the flexible boards TP of the flexible printed circuit boards FPCB1 and FPCB2 may successively increase. For example, stress applied to at least one flexible board TP disposed adjacent/nearest to the center of each of the printed circuit boards PCB1 and PCB2 of the flexible printed circuit boards FPCB1 and FPCB2 may have a minimum value compared to the other flexible boards TP disposed further away from the center of each of the printed circuit boards PCB1 and PCB2.

For example, stress having a first intensity may be applied to the third flexible board TP3 disposed at the center of each of the first printed circuit board PCB1 and the second printed circuit board PCB2. In an exemplary embodiment of the inventive concept, the first intensity may be zero. The stress may be applied to ends of the flexible boards TP disposed at one side in a direction of one side, and also, the stress may be applied to ends of the flexible boards TP disposed on the other side in a direction of the other side.

The second flexible board TP2 and the fourth flexible board TP4 may have the same first intensity, and the stress may be applied in directions opposite to each other. The first flexible board TP1 and the fifth flexible board TP5 may have the same second intensity, and the stress may be applied in directions opposite to each other. The second intensity is greater than the first intensity.

According to an exemplary embodiment, since the display apparatus 1000 is assembled, and since the display module DM is bent, each of the first to fifth flexible boards TP1 to TP5 disposed on each of the printed circuit boards PCB1 and PCB2 may be changed in shape and/or size. Each of the first to fifth flexible boards TP1 to TP5 disposed on each of the first and second printed circuit boards PCB1 and PCB2 may have deformation that is proportional to the stress applied to each of the first to fifth flexible boards TP1 to TP5. For example, the more stress that is applied to each of the first to fifth flexible boards TP1 to TP5, the more the boards may be deformed. Even though the display module DM is bent, the third flexible board TP3 may not be changed in shape or size.

For example, the extension direction of each of the flexible boards TP1 to TP5 may be tilted from a normal direction at a point on the display panel DP at which each of the flexible boards TP1 to TP5 is connected to the display panel DP in proportion to the intensity of the stress applied to each of the flexible boards TP1 to TP5. For example, as the flexible boards TP1 to TP5 are disposed further away from the center of each of the printed circuit boards PCB1 and PCB2, the tilted angle of the extension direction of each of the flexible boards TP1 to TP5 from the normal direction at the point on the display panel DP at which each of the flexible boards TP1 to TP5 is connected to the display panel DP may increase. Thus, the tilted angle of the extension direction of the second and fourth flexible boards TP2 and TP4 from the normal direction at the point on the display panel DP at which each of the second and fourth flexible boards TP2 and TP4 is connected to the display panel DP may be greater than that of the extension direction of the third flexible board TP3 from the normal direction K1 (see FIG. 8) at the point on the display panel DP at which the third flexible board TP3 is connected to the display panel DP. The tilted angle of the extension direction of the first and fifth flexible boards TP1 and TP5 from the normal direction at the point on the display panel DP at which each of the first and fifth flexible boards TP1 and TP5 is connected to the display panel DP may be greater than that of the extension direction of each of the second and fourth flexible boards TP2 and TP4 from the normal direction at the point on the display panel DP at which each of the second and fourth flexible boards TP2 and TP4 is connected to the display panel DP.

Also, an extending length of each of the flexible boards TP1 to TP5 may increase in proportion to the intensity of the stress applied to each of the flexible boards TP1 to TP5. Thus, even though the display module DM is bent, the third flexible board TP3 may not increase in extending length. The extending length of each of the second and fourth flexible boards TP2 and TP4 may be greater than that of the third flexible board TP3. The extending length of each of the first and fifth flexible boards TP1 and TP5 may be greater than that of each of the second and fourth flexible boards TP2 and TP4.

In an exemplary embodiment, the other end of each of the flexible boards of the first flexible printed circuit board FPCB1 is connected to one surface of the first printed circuit board PCB1, and as the display module DM is assembled, the first printed circuit board PCB1 is fixed to the bottom part BBC of the curved accommodation member BC so that the one surface faces an outer lower side. However, the inventive concept is not limited thereto. For example, in an exemplary embodiment of the inventive concept, the other end of each of the flexible boards TP of the first flexible printed circuit board FPCB1 may be connected to the other surface facing the one surface of the first printed circuit board PCB1, and as the display module DM is assembled, the first printed circuit board PCB1 may be fixed to the bottom part BBC of the curved accommodation member BC so that the other surface faces the bottom part BBC.

In an exemplary embodiment, the other end of each of the flexible boards TP of the first and second flexible printed circuit boards FPCB1 and FPCB2 is connected to one surface of the first and second printed circuit boards PCB1 and PCB2, and as the display module DM is assembled, the first and second printed circuit boards PCB1 and PCB2 are fixed to the bottom part BBC of the curved accommodation member BC so that the one surface faces an outer lower portion of the display apparatus 1000. However, the inventive concept is not limited thereto. For example, in an exemplary embodiment of the inventive concept, the other end of each of the flexible boards TP of the first and second flexible printed circuit boards FPCB1 and FPCB2 may be connected to the other surface facing the one surface of each of the first and second printed circuit boards PCB1 and PCB2, and as the display module DM is assembled, the first and second printed circuit boards PCB1 and PCB2 may be fixed to the bottom part BBC of the curved accommodation member BC so that the other surface faces the bottom part BBC.

Figure 9:
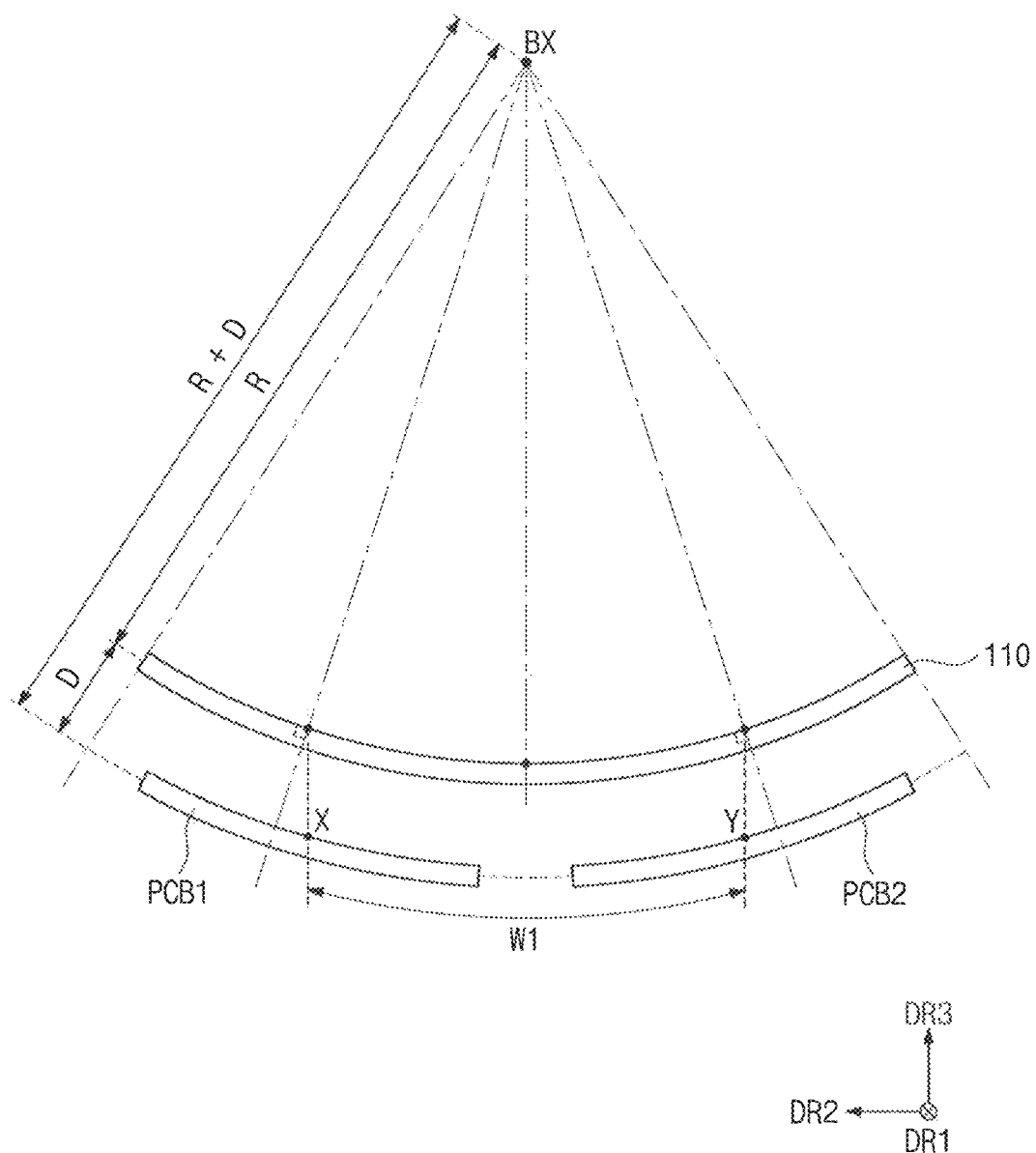
FIG. 9 is a cross-sectional view illustrating a relative position between the display panel and the printed circuit boards before assembly.
Figure 10:
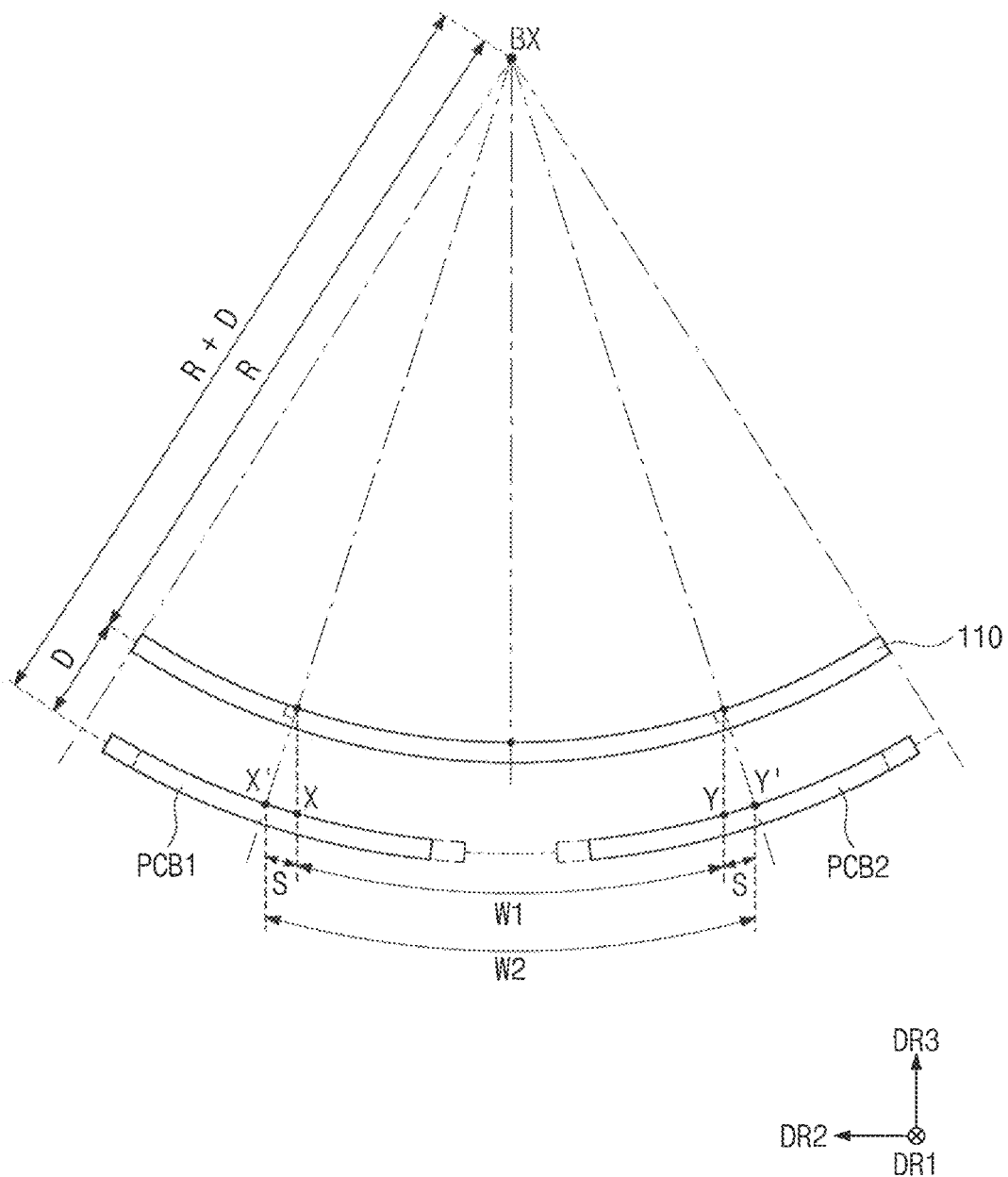
FIG. 10 is a cross-sectional view illustrating a relative position between the display panel and the printed circuit boards after assembly.

FIG. 9 is a cross-sectional view illustrating a relative position between the display panel and the printed circuit boards before assembly. FIG. 10 is a cross-sectional view illustrating a relative position between the display panel and the printed circuit boards after assembly. In FIGS. 9 and 10, for convenience of description, the flexible printed circuit boards FPCB1 and FPCB2 and the bottom chassis (e.g., the accommodation member BC) will be omitted.

Referring to FIGS. 9 and 10, a curvature radius of the first substrate 110 of the display panel DP, to which the flexible printed circuit boards FPCB1 and FPCB2 are connected, is defined as R. When the thickness of the curved accommodation member BC is defined as D, the curvature radius of each of the first and second printed circuit boards PCB1 and PCB2 may be R+D.

According to an exemplary embodiment, as described above, as the display module DM is attached to the curved accommodation member BC during assembly, the first and second printed circuit boards PCB1 and PCB2 may be shifted to the outside of the display apparatus 1000. When a distance between a center X of the first printed circuit board PCB1 and a center Y of the second printed circuit board PCB2 before the first and second printed circuit boards PCB1 and PCB2 are shifted is defined as W1, a distance between a center X' of the first printed circuit board PCB1 and a center Y' of the second printed circuit board PCB2 after the first and second printed circuit boards PCB1 and PCB2 are shifted is defined as W2. A difference between the distances W1 and W2 is equal to a difference 2S (where S is a moving distance of each of the first and second printed circuit boards PCB1 and PCB2, as described below) of a spaced distance between the first printed circuit board PCB1 and the second printed circuit board PCB2.

According to an exemplary embodiment, a minimum value of a difference between the above-described first distance DS1 (see FIG. 7) and second distance DS2 (see FIG. 7) may be $D*W1/2*R$. Here, an error range may be about ±10%. For example, a minimum value of a moving distance S of each of the first and second printed circuit boards PCB1 and PCB2 due to the bending of the display module DM may be $D*W1/2*R$ within an error range of about ±10%. That is, the minimum value of the moving distance S of each of the first and second printed circuit boards PCB1 and PCB2 may range from $9*D*W1/20*R$ to $11*D*W1/20*R$.

As a result, according to an exemplary embodiment of the inventive concept, when the flat panel display panel DP (see FIGS. 1 to 3) on which the bonding with the printed circuit boards PCB1 and PCB2 are completed is disposed on the curved accommodation member BC so as to be bent in the direction in which the bending axis BX (see FIGS. 1 to 3) are surrounded, the printed circuit boards PCB1 and PCB2 may be shifted to the outside of the display apparatus 1000 and may then be fixed to the rear surface of the curved accommodation member BC. In this case, the stress applied to the flexible printed circuit boards FPCB1 and FPCB2 connected to each of the printed circuit boards PCB1 and PCB2 may be minimized or reduced. Thus, according to an exemplary embodiment of the inventive concept, the durability of the display apparatus 1000 may be improved.

Figure 11:
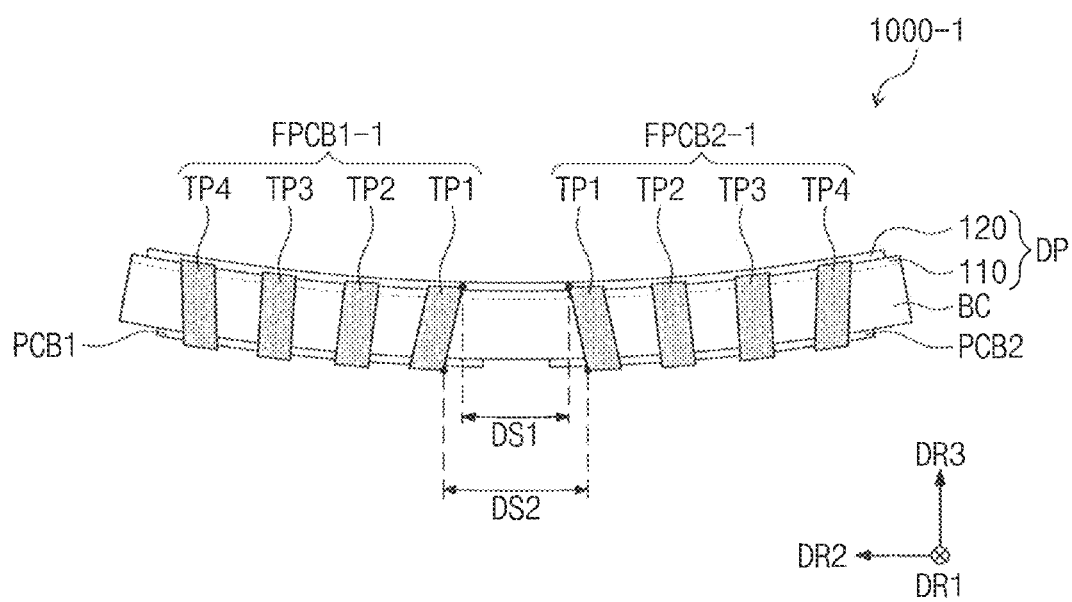
FIG. 11 is a front view of a display apparatus according to an exemplary embodiment of the inventive concept.
Figure 12:
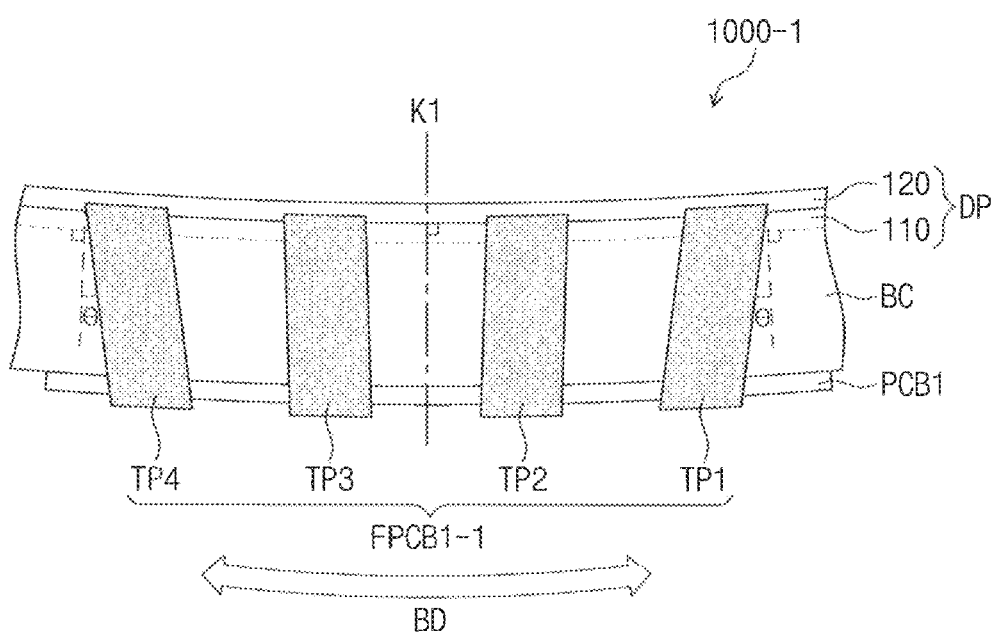
FIG. 12 is an enlarged view of first flexible printed circuit boards of FIG. 11.

FIG. 11 is a front view of a display apparatus according to an exemplary embodiment of the inventive concept. FIG. 12 is an enlarged view of first flexible printed circuit boards of FIG. 11.

For convenience of description, differences between the exemplary embodiment of FIG. 11 and the exemplary embodiments previously described will be mainly described, and a repeated description of elements and functionality previously described may be omitted. The same reference numerals and symbols are given to the same component, and duplicated descriptions thereof may be omitted.

In FIG. 11, first and second flexible printed circuit boards FPCB1-1 and FPCB2-1, each of which includes four flexible boards TP1 to TP4, will be described as an example. For convenience of description, since a first printed circuit board PCB1 and the first flexible printed circuit board FPCB1-1, which will be described below, have the same configuration as a second printed circuit board PCB2 and the second flexible printed circuit board FPCB2-1, only the first printed circuit board PCB1 and the first flexible printed circuit board FPCB1-1 will be described with reference to FIG. 12.

Referring to FIGS. 11 and 12, each of the first and second flexible printed circuit boards FPCB1-1 and FPCB2-1 of a display apparatus 1000-1 according to an exemplary embodiment of the inventive concept may be provided in an even number. For example, the first printed circuit board PCB1 and the display panel DP are connected to each other by first to fourth flexible boards TP1 to TP4 of the first flexible printed circuit board FPCB1-1, and the second printed circuit board PCB2 and the display panel DP are connected to each other by first to fourth flexible boards TP1 to TP4 of the second flexible printed circuit board FPCB2-1.

According to an exemplary embodiment, the first to fourth flexible boards TP1 to TP4 connected to each of the printed circuit boards PCB1 and PCB2 may pass through a center of each of the printed circuit boards PCB1 and PCB2 and may be symmetrical to each other with respect to a normal direction K1 perpendicular to a top surface of the first substrate 110 of the display panel DP, as shown in FIG. 12. In an exemplary embodiment, the first to fourth flexible boards TP1 to TP4 do not overlap the normal direction K1.

According to an exemplary embodiment, when a display module is completely assembled, as the flexible boards TP of the flexible printed circuit boards FPCB1-1 and FPCB2-1 disposed on each of the printed circuit boards PCB1 and PCB2 are further away from a center of each of the printed circuit boards PCB1 and PCB2, stress applied to each of the flexible boards TP of the flexible printed circuit boards FPCB1-1 and FPCB2-1 may successively increase. In an exemplary embodiment, an intensity of the stress applied to each of the first to fourth flexible boards TP1 to TP4 is greater than zero.

For example, the second flexible board TP2 and the third flexible board TP3 may have the same third intensity, and the stress may be applied in directions opposite to each other. The first flexible board TP1 and the fourth flexible board TP4 may have the same fourth intensity, and the stress may be applied in directions opposite to each other. The fourth intensity is greater than the third intensity.

Hereinafter, for convenience of description, differences between the exemplary embodiment described with reference to FIGS. 13 to 17 and the previously described exemplary embodiments will be mainly described, and a repeated description of elements and functionality previously described may be omitted. The same reference numerals and symbols are given to the same component, and duplicated descriptions thereof may be omitted.

Figure 13:
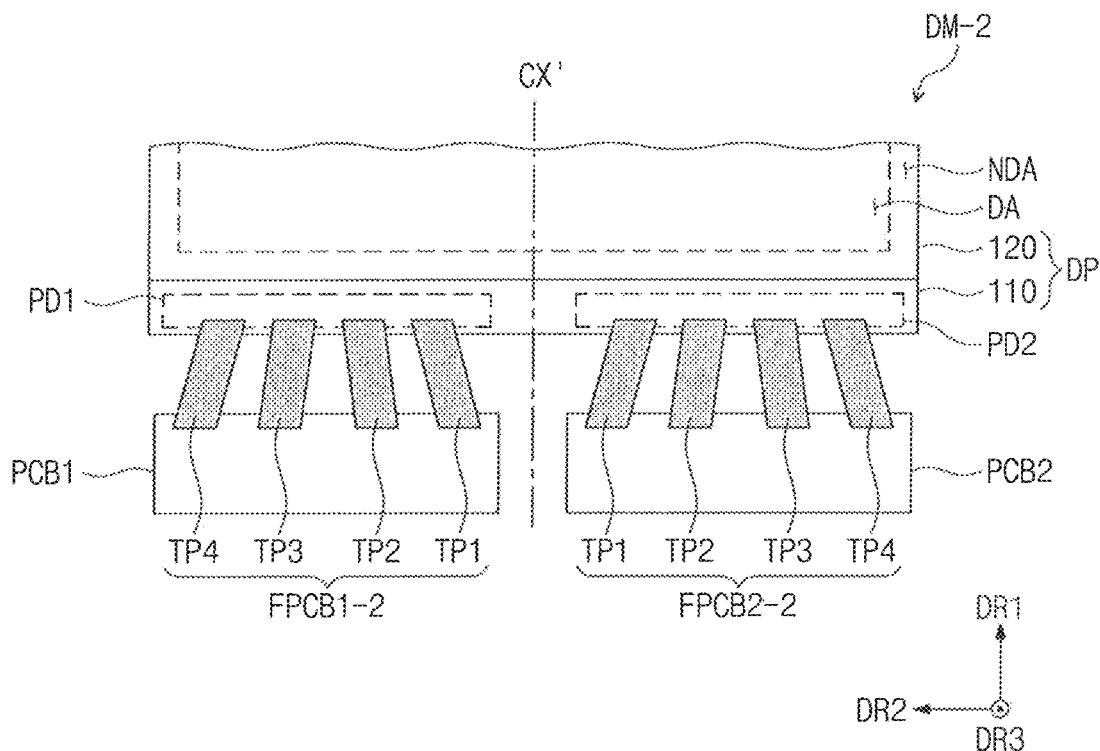
FIG. 13 is a plan view of a display module after a bonding process is completely performed according to an exemplary embodiment of the inventive concept.
Figure 14:
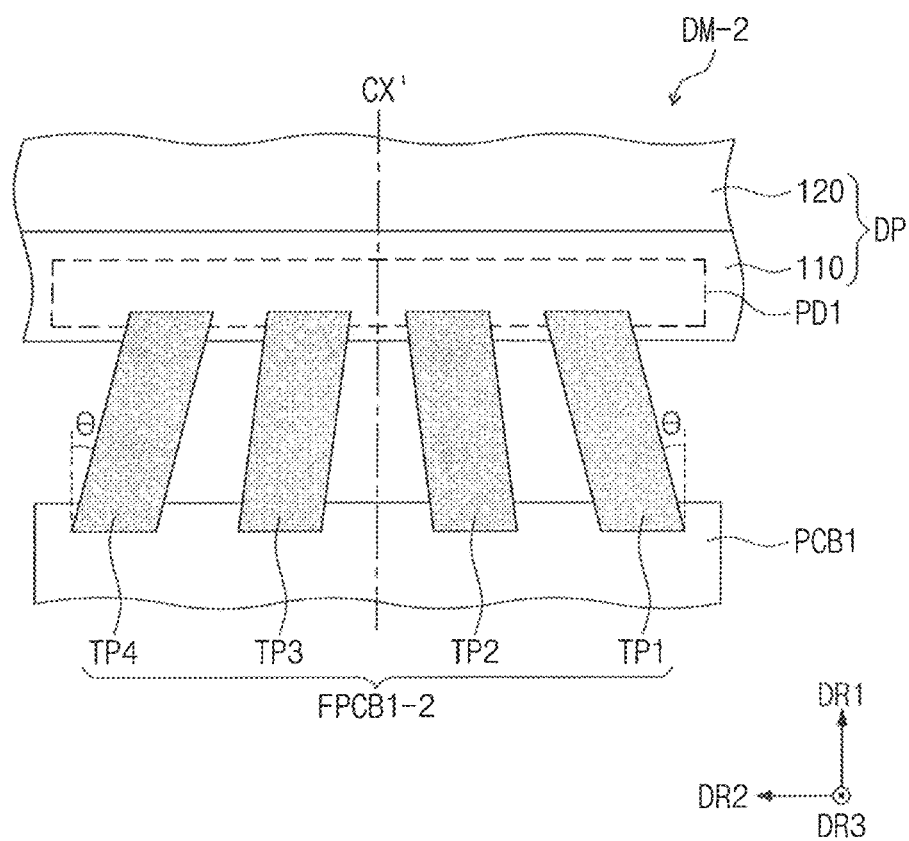
FIG. 14 is an enlarged view of first flexible printed circuit boards of FIG. 13.

FIG. 13 is a plan view of a display module after a bonding process is completely performed according to an exemplary embodiment of the inventive concept. FIG. 14 is an enlarged view of the first flexible printed circuit boards of FIG. 13.

For convenience of description, in FIGS. 14 to 17, since the first printed circuit board PCB1 and the first flexible printed circuit board FPCB1-2, which will be described below, have the same configuration as the second printed circuit board PCB2 and the second flexible printed circuit board FPCB2-2, only the first printed circuit board PCB1 and the first flexible printed circuit board FPCB1-2 will be described.

Referring to FIGS. 13 and 14, a display module DM-2 according to an exemplary embodiment of the inventive concept may has a flat plate shape. For example, the display panel DM-2 before the assembly may be parallel to the plane defined by the first direction DR1 and the second direction DR2.

The first to fourth flexible boards TP1 to TP4 connected to each of the printed circuit boards PCB1 and PCB2 of the display module DM-2 before assembly may be tilted in the first direction DR1. The flexible boards TP1 to TP4 may pass through the center of each of the printed circuit boards PCB1 and PCB2 and be symmetrical to each other with respect to a virtual line CX' parallel to the first direction DR1.

For example, an angle θ between an extension direction of each of the flexible boards TP1 to TP4 and the first direction DR1 may increase in the order of the flexible boards TP1 to TP4 disposed further away from the center of each of the printed circuit boards PCB1 and PCB2. Each of the flexible boards TP1 and TP4 may be tilted so that one end of each of the flexible boards TP1 to TP4 is disposed further adjacent to the virtual line CX' than the other end of each of the flexible boards TP1 to TP4.

According to an exemplary embodiment, as the flexible boards TP1 and TP4 are disposed further away from the virtual line CX', an extending length of each of the flexible boards TP1 and TP4 may increase.

Figure 15:
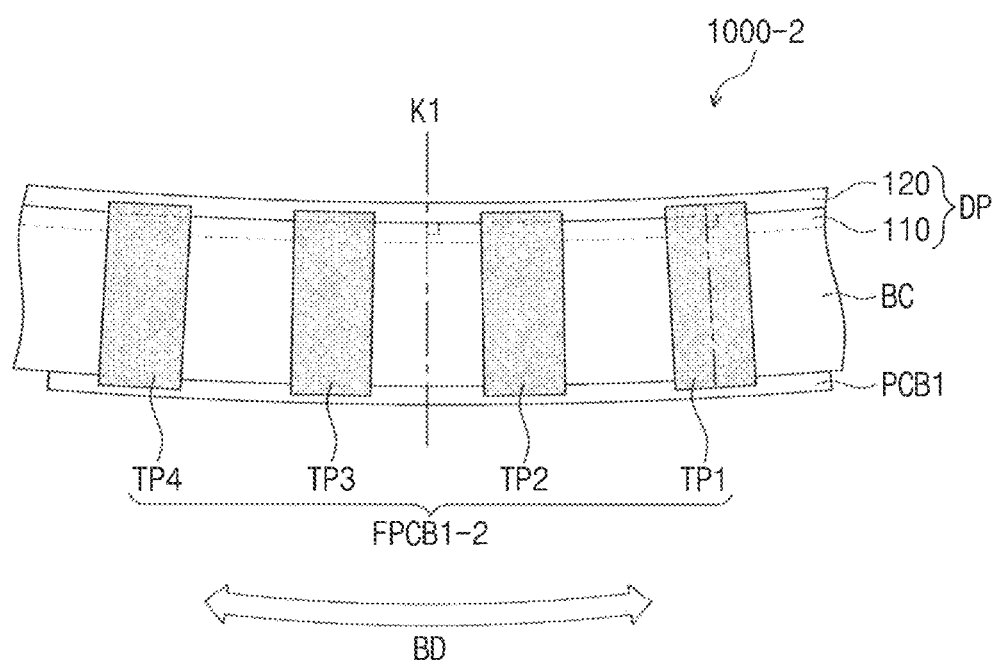
FIG. 15 is a front view of a display apparatus including the display module of FIG. 13 after being completely assembled.
Figure 16:
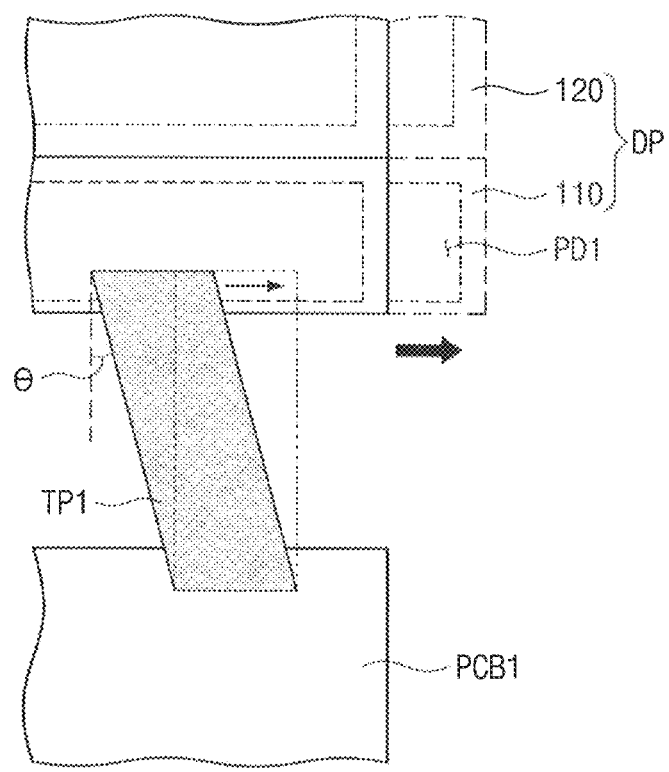
FIG. 16 is a view illustrating a state before and after the first flexible board of FIG. 13 is assembled.
Figure 17:
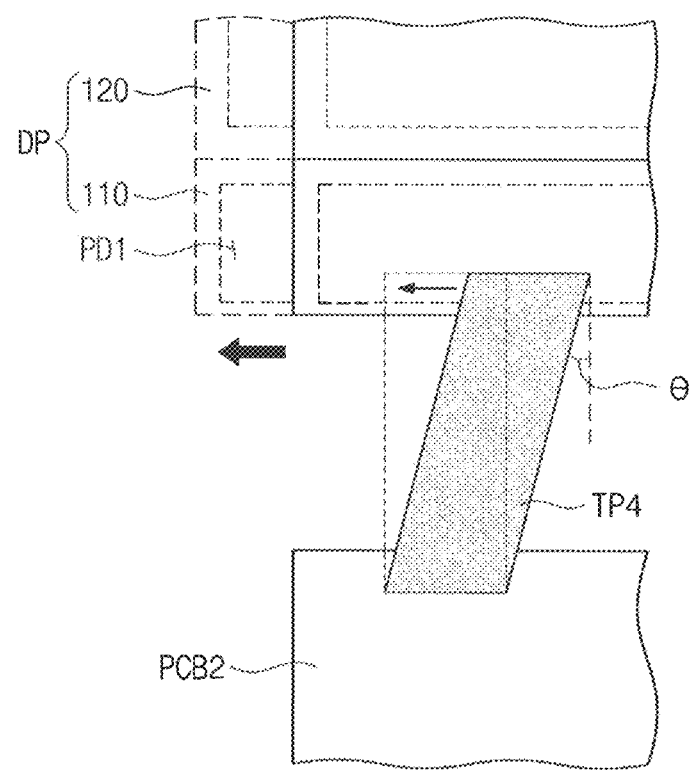
FIG. 17 is a view illustrating a state before and after the fourth flexible board of FIG. 13 is assembled.

FIG. 15 is a front view of a display apparatus including the display module of FIG. 13 after being completely assembled. FIG. 16 is a view illustrating a state before and after the first flexible board of FIG. 13 is assembled. FIG. 17 is a view illustrating a state before and after the fourth flexible board of FIG. 13 is assembled. For convenience of description, FIGS. 16 and 17 illustrate only the first and fourth flexible boards TP1 and TP4 disposed at the outermost sides of the first flexible printed circuit board FPCB1-2.

Referring to FIGS. 15 to 17, after the bonding process of the display module DM-2 of a display apparatus 1000-2 is completed, the display module DM-2 may be bent in a bending direction BD by an external pressure. For example, since the display module DM-2 is fixed to a curved accommodation member BC, the display module DM-2 may be bent on the curved accommodation member BC in a direction in which the bending axis BX (see FIGS. 1 to 3) are surrounded.

According to an exemplary embodiment, when the display module DM-2 is completely assembled, the flexible boards TP1 to TP4 connected to each of the printed circuit boards PCB1 and PCB2 may have the same length. An extending direction of each of the flexible boards TP1 to TP4 may pass through the center of each of the printed circuit boards PCB1 and PCB2 and be parallel to a normal direction K1 perpendicular to a top surface of the first substrate 110 of the display panel DP.

For example, according to an exemplary embodiment, in a process before the display module DM-2 is assembled, as the display module DM-2 is bent, each of the flexible boards TP1 to TP4 may be previously tilted and extend to correspond to the intensity of the stress to be applied to each of the flexible boards TP1 to TP4. As the display module DM-2 is bent, when the bonding process is performed, stress may be applied to each of the tilted and extending flexible boards TP1 to TP4. Thus, the extending direction of each of the flexible boards TP1 to TP4 may be deformed in a direction parallel to the normal direction at a point on the display panel DP at which each of the flexible boards TP1 to TP4 is connected to the display panel DP.

Figure 18:
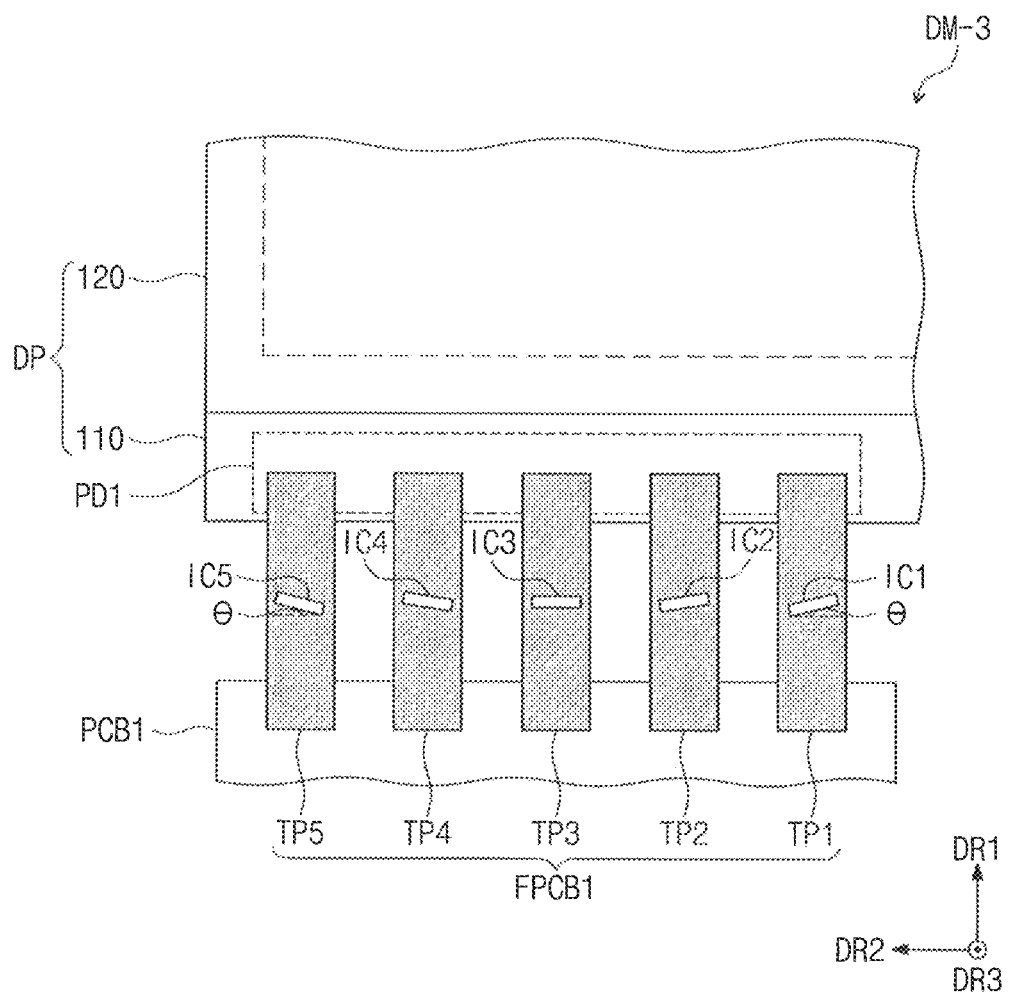
FIG. 18 is a plan view of a display module according to an exemplary embodiment of the inventive concept.
Figure 19:
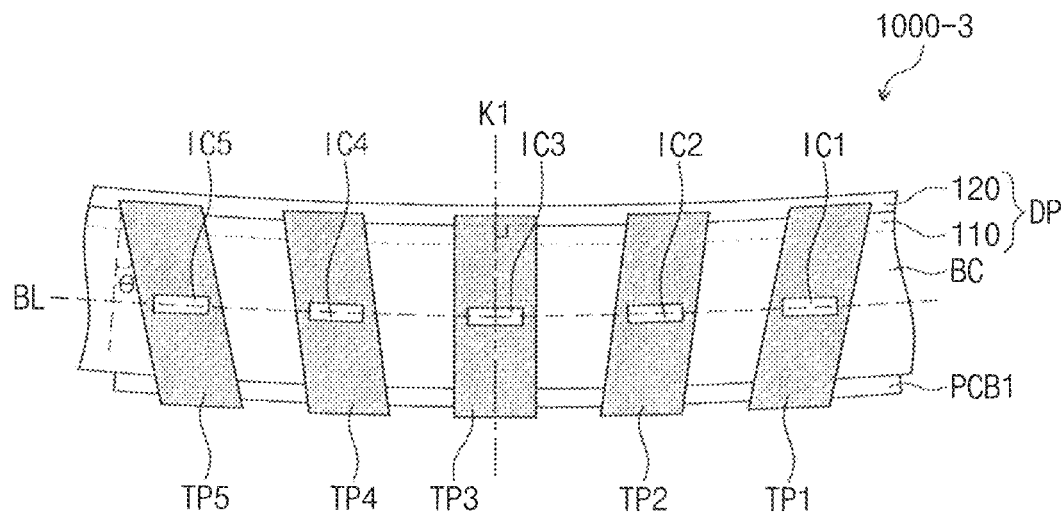
FIG. 19 is a front view of a display apparatus including the display module of FIG. 18 after being completely assembled.

FIG. 18 is a plan view of a display module according to an exemplary embodiment of the inventive concept. FIG. 19 is a front view of a display apparatus including the display module of FIG. 18 after being completely assembled.

For convenience of description, differences between the exemplary embodiment of FIGS. 18 and 19 and the exemplary embodiments previously described will be mainly described, and a repeated description of elements and functionality previously described may be omitted. The same reference numerals and symbols are given to the same component, and duplicated descriptions thereof may be omitted.

For convenience of description, since the first printed circuit board PCB1 and the first flexible printed circuit board FPCB1, which will be described below, have the same configuration as the second printed circuit board PCB2 and the second flexible printed circuit board FPCB2, only the first printed circuit board PCB1 and the first flexible printed circuit board FPCB1 will be described with reference to FIG. 18.

Referring to FIGS. 18 and 19, each of the first and second flexible printed circuit boards FPCB1 and FPCB2 according to an exemplary embodiment of the inventive concept may include a plurality of driving chips IC1 to IC5 mounted on each of the first and second flexible printed circuit boards FPCB1 and FPCB2. The driving chips IC1 to IC5 may include first driving chips IC1 to IC5 mounted in a one-to-one correspondence with the flexible boards TP of the first flexible printed circuit board FPCB1, and second driving chips IC1 to IC5 mounted in a one-to-one correspondence with the flexible boards TP of the second flexible printed circuit board FPCB2.

According to an exemplary embodiment, before a display module DM-3 is assembled, an extending direction of the driving chips IC1 to IC5 may be tilted from the second direction DR2 that is an extending direction of the first and second printed circuit boards PCB1 and PCB2.

For example, as the flexible boards TP of the flexible printed circuit boards FPCB1 and FPCB2 disposed on each of the printed circuit boards PCB1 and PCB2 are disposed further away from a center of each of the printed circuit boards PCB1 and PCB2, a tilted angle θ of the extending direction of the driving chips IC1 to IC5 mounted on each of the flexible boards TP of the flexible printed circuit boards FPCB1 and FPCB2 from the second direction DR2 may increase.

Referring to FIG. 19, as a display apparatus 1000-3 is assembled, the display module DM-3 of FIG. 18 may be bent. As the display module DM-3 is bent, each of the first to fifth flexible boards TP1 to TP5 disposed on each of the printed circuit boards PCB1 and PCB2 may be changed in shape and size. Thus, the extending direction of the driving chips IC1 to IC5 may be changed.

For example, on a cross-section, a virtual line connecting central points of a top surface of the first substrate 110 of the display panel DP, on which one end of the first flexible printed circuit board FPCB1 is disposed, and one surface of the first printed circuit board PCB1, on which the other end of the first flexible printed circuit board FPCB1 is disposed, may be defined as a bending line BL. According to an exemplary embodiment, when the display module DM-3 is assembled, the extending direction of each of the driving chips IC1 to IC5 may be parallel to the bending line BL.

While the display module DM-3 is assembled, as each of the flexible boards TP1 to TP5 is changed in shape and size, stress may be applied between each of the flexible boards TP1 to TP5 and the driving chips IC1 to IC5 respectively mounted on the corresponding flexible boards TP1 to TP5. According to an exemplary embodiment, the extending direction of each of the driving chips IC1 to IC5 may be tilted to reduce the stress occurring between the flexible boards TP1 to TP5 and the driving chips IC1 to IC5.

Figure 20A:
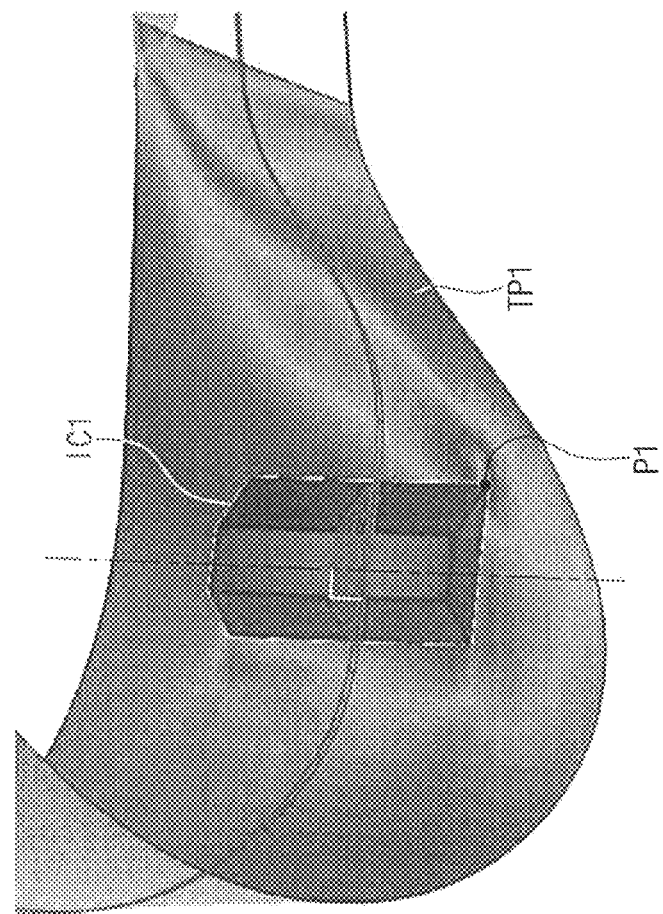
FIGS. 20A and 20B are views illustrating distribution for each area with respect to an amount of stress applied to the flexible printed circuit board according to a position of a driving chip of FIG. 18.
Figure 20A:
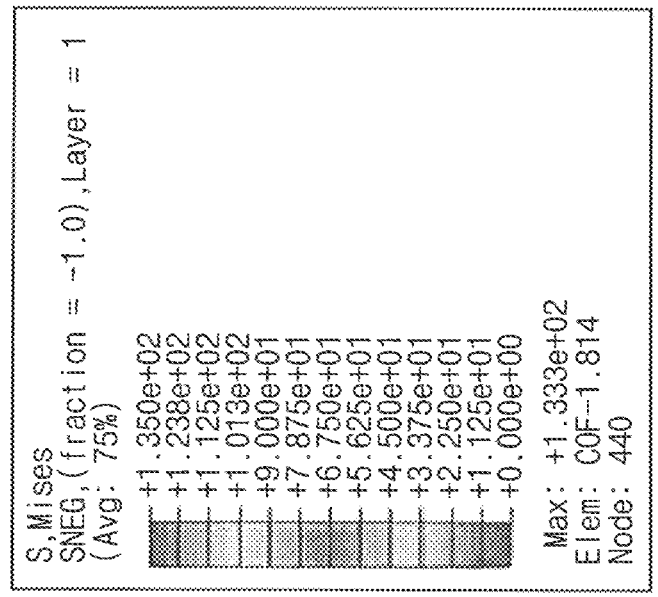
Figure 20B:
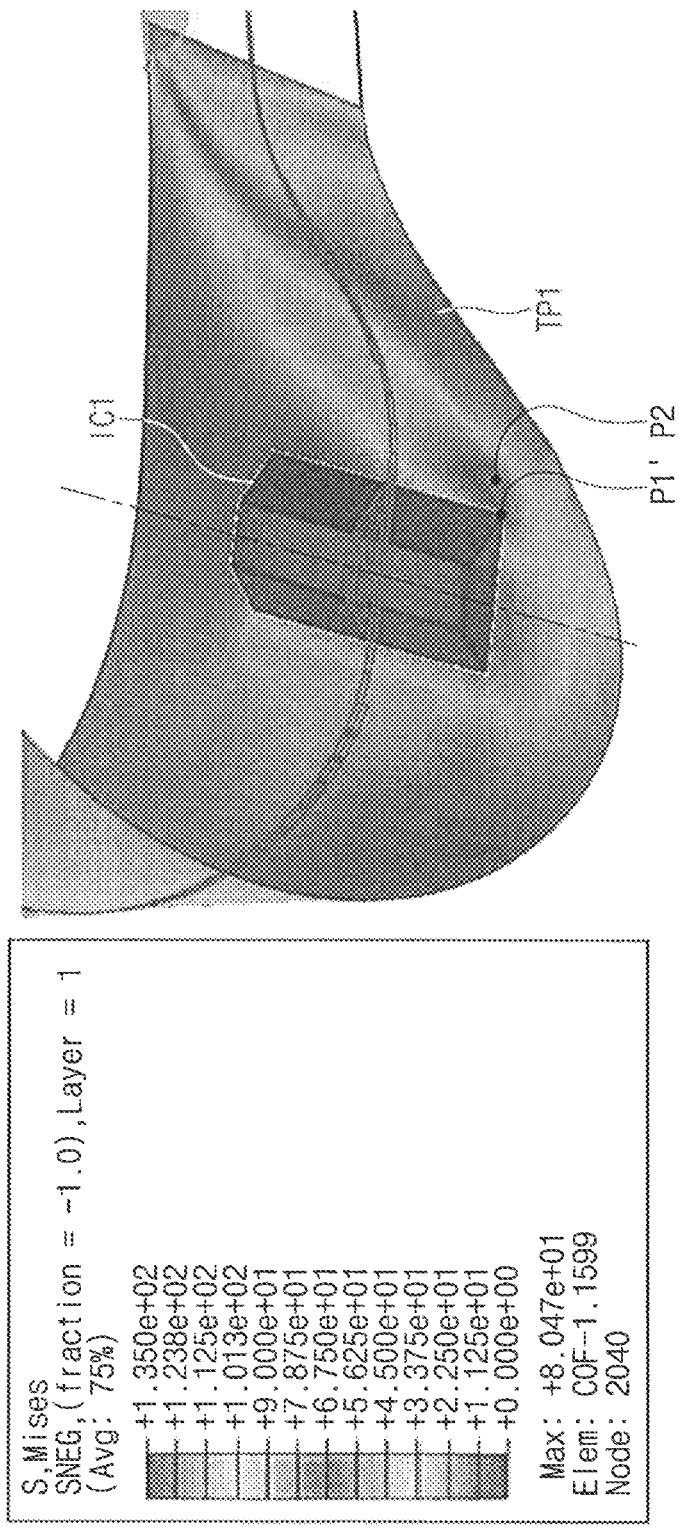

FIGS. 20A and 20B are views illustrating distribution for each area with respect to an amount of stress applied to the flexible printed circuit board according to a position of the driving chip of FIG. 18. FIGS. 20A and 20B illustrate an example of the first flexible board TP1 of the flexible printed circuit board FPCB1 and the driving chip IC1 mounted on the first flexible board TP1 in the above-described flexible boards TP1 to TP5 and driving chips IC1 to IC5. FIG. 20A illustrates a case in which the driving chip IC1 is not tilted as a comparative example, and FIG. 20B illustrates the flexible board TP1 and the driving chip IC1 according to an exemplary embodiment of the inventive concept.

As illustrated in FIG. 20A, stress is applied to the assembled first flexible board TP1. The maximum stress may be applied to a first point P1 of an area of the first flexible board TP1. Unlike exemplary embodiments of the inventive concept, before assembly, when the extending direction of the driving chip IC1 is parallel to the extending direction of the first flexible board TP1, an edge of the driving chip IC1 may overlap the first point P1. Thus, the maximum value of the stress applied to the first flexible board TP1 may increase by the driving chip IC1. Here, an amount of stress applied to the first point P1 may be about 133.3 MPa.

Referring to FIG. 20B, the driving chip IC1 according to an exemplary embodiment of the inventive concept may extend to be tilted with respect to the normal direction (see FIGS. 18 and 19) in the extending direction of the first flexible board TP1. For example, in FIG. 20A, one edge of the driving chip IC1 overlapping the first point P1' of the first flexible board TP1 may overlap a second point P2 of the first flexible board TP1 as the driving chip IC1 is tilted. An amount of stress applied to the second point P2 may be about 122.8 MPa. In this exemplary embodiment, an amount of stress applied to a first point P1' may be about 80.5 MPa.

As described above, according to an exemplary embodiment, when the display module is assembled, the driving chips IC1 to IC5 may be tilted at an angle corresponding to an intensity of the stress to be applied to each of the flexible boards TP1 to TP5 and then mounted on the flexible boards TP1 to TP5. Thus, even though the display module is bent, the maximum value of the stress applied between the flexible boards TP1 to TP5 and the driving chips IC1 to IC5 may be reduced.

Figure 21:
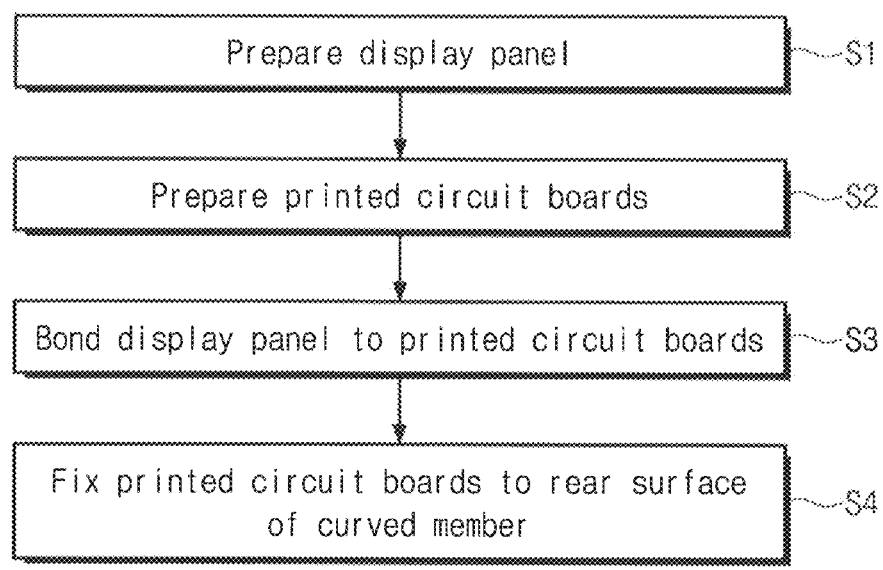
FIG. 21 is a flowchart illustrating a method for manufacturing a display apparatus according to an exemplary embodiment of the inventive concept.

FIG. 21 is a flowchart illustrating a method for manufacturing a display apparatus according to an exemplary embodiment of the inventive concept.

Hereinafter, a method for manufacturing a display apparatus 1000 according to an exemplary embodiment of the inventive concept will be described with reference to FIGS. 1 to 10 and 21.

First, as illustrated in FIGS. 5 and 21, a flat display panel DP and a plurality of printed circuit boards PCB1 and PCB2 are prepared (operations S1 and S2). A first pad unit PD1 and a second pad unit PD2, which include a plurality of first and second panel bonding areas PBA1 and PBA2, may be disposed on the display panel DP.

A plurality of board bonding areas BBA1 and BBA2 are disposed on each of the printed circuit boards PCB1 and PCB2. For example, the first board boding areas BBA1 may be disposed on the first printed circuit board PCB1, and the second board bonding areas BBA2 may be disposed on the second printed circuit board PCB2.

Thereafter, as illustrated in FIGS. 4, 6 and 21, the display panel DP and the printed circuit boards PCB1 and PCB2 are bonded to the plurality of flexible printed circuit boards FPCB1 and FPCB2 (operation S3). The first flexible printed circuit board FPCB1 may be connected so that panel bonding areas PBA1 of the display panel DP and the first board bonding areas BBA1 of the first printed circuit board PCB1 are in a one-to-one correspondence with each other, and the second flexible printed circuit board FPCB2 may be connected so that second panel bonding areas PBA2 of the display panel DP and the second board bonding areas BBA2 of the second printed circuit board PCB2 are in a one-to-one correspondence with each other. When the bonding process is completed, each of the flexible printed circuit boards FPCB1 and FPCB2 extends in parallel to the second direction DR2.

Thereafter, as illustrated in FIGS. 1, 2, 7, and 21, a curved accommodation member BC is disposed between the display panel DP and each of the printed circuit boards PCB1 and PCB2. The display panel DP may be disposed on an upper portion of a bottom part BBC of the curved accommodation member BC, and the printed circuit boards PCB1 and PCB2 may be disposed on a lower portion of the bottom part BBC of the curved accommodation member BC.

The curved accommodation member BC may have a shape that is curved in a direction in which a bending axis X is surrounded, and may have a rigidity greater than that of the display panel DP. At least two alignment marks may be formed on a rear surface of the curved accommodation member BC.

Thereafter, the printed circuit boards PCB1 and PCB2 are fixed to correspond to the alignment marks formed on the rear surface of the bottom part BBC of the curved accommodation member BC (operation S4). According to an exemplary embodiment, a distance between the fixed first and second printed circuit boards PCB1 and PCB2 may be greater than the distance between the first and second printed circuit boards PCB1 and PCB2 before being fixed. In this case, the stress applied to the flexible printed circuit boards FPCB1 and FPCB2 connected to each of the first and second printed circuit boards PCB1 and PCB2 may be reduced.

As a result, according to an exemplary embodiment of the inventive concept, a display apparatus 1000 having improved durability may be manufactured.

According to exemplary embodiments of the inventive concept, a display apparatus may have improved durability and reliability.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A display apparatus, comprising:
a display panel bendable in a bending direction about a bending axis;
a first pad unit and a second pad unit disposed on one side of the display panel, wherein the first and second pad units extend in the bending direction and are arranged in the bending direction;
a curved member disposed below the display panel;
a first printed circuit board (PCB) and a second PCB fixed to a rear surface of the curved member and spaced apart from each other in the bending direction;
a first flexible printed circuit board (FPCB) comprising a plurality of first flexible boards, each of which has a first end connected to the first pad unit and a second end connected to the first PCB; and
a second FPCB comprising a plurality of second flexible boards, each of which has a first end connected to the second pad unit and a second end connected to the second PCB,
wherein the first flexible board closest to the second pad unit is defined as a first outermost flexible board, and the second flexible board closest to the first pad unit is defined as a second outermost flexible board, and
a first distance defined as a distance between the first end of the first outermost flexible board and the first end of the second outermost flexible board is less than a second distance defined as a distance between the second end of the first outermost flexible board and the second end of the second outermost flexible board.

2. The display apparatus of claim 1, wherein a rigidity of the curved member is greater than a rigidity of the display panel.

3. The display apparatus of claim 2, wherein the curved member comprises at least one of a light guide plate, an optical sheet, a mold frame, or a bottom chassis.

4. The display apparatus of claim 1, wherein the first and second PCBs are bendable in the bending direction about the bending axis.

5. The display apparatus of claim 1, wherein, as the first flexible boards are disposed further away from a center of the first PCB, a tilted angle of each of the first flexible boards from a normal direction at a point on the display panel at which each of the first flexible boards is connected to the display panel increases, and
as the second flexible boards are disposed further away from a center of the second PCB, a tilted angle of each of the second flexible boards from a normal direction at a point on the display panel at which each of the second flexible boards is connected to the display panel increases.

6. The display apparatus of claim 5, wherein a length of each of the first flexible boards increases as the first flexible boards are disposed further away from the center of the first PCB, and
a length of each of the second flexible boards increases as the second flexible boards are disposed further away from the center of the second PCB.

7. The display apparatus of claim 1, further comprising:
a plurality of first driving chips mounted in a one-to-one correspondence with the first flexible boards; and
a plurality of second driving chips mounted in a one-to-one correspondence with the second flexible boards,
wherein extending directions of each of the first driving chips and each of the second driving chips are parallel to the bending direction.

8. The display apparatus of claim 1, wherein, when the display panel is bent, each of the first outermost flexible board and the second outermost flexible board has a rectangular shape.

9. The display apparatus of claim 8, wherein, when the display panel is bent, lengths of each of the first flexible boards and each of the second flexible boards are the same.

10. The display apparatus of claim 1, further comprising:
a plurality of first driving chips mounted in a one-to-one correspondence with the first flexible boards; and
a plurality of second driving chips mounted in a one-to-one correspondence with the second flexible boards,
wherein, on a cross-section, a virtual line comprising central points of a distance between one surface of the display panel and one surface of the first PCB and central points of a distance between the one surface of the display panel and one surface of the second PCB is defined as a bending line, and
extending directions of each of the first driving chips and each of the second driving chips are parallel to the bending line.

11. The display apparatus of claim 1, wherein, when a curvature radius of the display panel is defined as R, a thickness of the curved member is defined as D, and a distance between a center of the first PCB and a center of the second PCB is defined as W, a minimum value of a difference between the first distance and the second distance ranges from $9*D*W/20*R$ to $11*D*W/20*R$.

12. A method for manufacturing a display apparatus, the method comprising:

bonding a display panel and each of a plurality of printed circuit boards to a plurality of flexible printed circuit boards;

disposing the display panel on an upper portion of a bottom part of a curved member; and fixing each of the printed circuit boards to a rear surface of the bottom part of the curved member, wherein the curved member is bendable in a bending direction about a bending axis, and a distance between the printed circuit boards adjacent to each other after the printed circuit boards are fixed is greater than a distance between the printed circuit boards adjacent to each other before the printed circuit boards are fixed.

13. The method of claim 12, wherein a pad unit is disposed on one side of the display panel in a first direction parallel to the bending axis, the printed circuit boards are arranged in a second direction crossing the first direction and extend in the second direction, and the flexible printed circuit boards connect the pad unit to the printed circuit boards.

14. The method of claim 13, wherein, when bonding the display panel and each of the printed circuit boards, the flexible printed circuit boards extend in the first direction and are disposed in parallel to the first direction, and when fixing the printed circuit boards, as the display panel is bent, the printed circuit boards are fixed to the curved member in an order of the flexible printed circuit boards disposed further away from a center of each of the printed circuit boards, and each of the flexible printed circuit boards increases in extending length.

15. The method of claim 13, wherein bonding the display panel and each of the printed circuit boards comprises bonding a plurality of driving chips to the flexible printed circuit boards in a one-to-one correspondence with each other.

16. The method of claim 13, wherein bonding the display panel and each of the printed circuit boards comprises:

bonding the flexible printed circuit boards to the display panel and each of the printed circuit boards in an order of the flexible printed circuit boards disposed further away from a center of each of the printed circuit boards, wherein an angle between an extending direction of one end of each of the flexible printed circuit boards and the first direction increases, and when fixing the printed circuit boards, as the display panel is bent, the printed circuit boards are fixed to the curved member such that the extending direction of each of the flexible printed circuit boards is parallel to a normal direction at a point on the display panel at which each of the flexible printed circuit boards is connected to the display panel.

17. The method of claim 16, wherein bonding the display panel and each of the printed circuit boards comprises:

bonding a plurality of driving chips to the flexible printed circuit boards in a one-to-one correspondence with the flexible printed circuit boards, wherein each of the driving chips is bonded in the order of the flexible printed circuit boards disposed further away from the center of each of the printed circuit boards, wherein an angle between a normal direction of the extending direction of the flexible printed circuit boards and an extending direction of the corresponding driving chips increases.

18. The method of claim 17, wherein, when fixing the printed circuit boards to the curved member, the extending direction of each of the driving chips is perpendicular to the normal direction of the extending direction of the flexible printed circuit boards.

19. The method of claim 12, wherein a rigidity of the curved member is greater than a rigidity of the display panel.

20. The method of claim 19, wherein the curved member comprises at least one of a light guide plate, an optical sheet, a mold frame, or a bottom chassis.

21. The method of claim 19, wherein the display panel is bent in a bending direction about the bending axis as the display panel is disposed on the curved member and as each of the printed circuit boards is fixed to a rear surface of the bottom part of the curved member.

22. The method of claim 21, wherein as the display panel is bent, a stress applied to at least one flexible printed circuit board closest to a center of each of the printed circuit boards is reduced.

23. The method of claim 22, wherein as the display panel is bent, the stress applied to each of the flexible printed circuit boards increases as the flexible printed circuit boards are disposed further away from the center of each of the printed circuit boards.

24. The method of claim 19, wherein each of the printed circuit boards is bent in a bending direction about the bending axis as the display panel is disposed on the curved member.

25. The method of claim 12, wherein fixing each of the printed circuit boards comprises:

forming alignment marks on the rear surface of the bottom part of the curved member; and fixing the printed circuit boards to the curved member such that the printed circuit boards correspond to the alignment marks.

26. The method of claim 12, wherein, when a curvature radius of the display panel is defined as R, a thickness of the curved member is defined as D, and a distance between a center of a first printed circuit board and a center of a second printed circuit board adjacent to the first printed circuit board is defined as W, a minimum value of a difference of a distance between the first and second printed circuit boards after the first and second printed circuit boards are fixed and a distance between the first and second printed circuit boards before the first and second printed circuit boards are fixed ranges from 9*D*W/20*R to 11*D*W/20*R.

27. A method for manufacturing a display apparatus, the method comprising:

bonding a display panel and each of a plurality of printed circuit boards to a plurality of flexible printed circuit boards;

disposing the display panel on an upper portion of a bottom part of a curved member; and fixing each of the printed circuit boards to a rear surface of the bottom part of the curved member, wherein the curved member is bendable in a bending direction about a bending axis, and when fixing the printed circuit boards, as the display panel is bent, the printed circuit boards are fixed such that deformation of the flexible printed circuit boards is successively reduced as the flexible printed circuit boards are disposed closer to a center of each of the printed circuit boards.

28. A display apparatus, comprising:

a display panel bendable in a bending direction about a bending axis;

a plurality of pad units disposed on one side of the display panel and arranged in the bendable direction;

a plurality of printed circuit boards disposed below the display panel, wherein the printed circuit boards are bendable in the bending direction about the bending axis, are arranged in the bendable direction, and extend in the bendable direction; and a plurality of flexible printed circuit boards configured to connect the display panel to the printed circuit boards, wherein each of the flexible printed circuit boards has a first end connected to the display panel and a second end connected to one of the printed circuit boards, and a second distance between the second ends of two of the flexible printed circuit boards respectively connected to two adjacent printed circuit boards is greater than a first distance between the first ends of the two flexible printed circuit boards.

29. The display apparatus of claim 28, further comprising:
a curved member disposed between the display panel and each of the printed circuit boards,
wherein the printed circuit boards are fixed to a rear surface of the curved member.

30. The display apparatus of claim 29, wherein, when a curvature radius of the display panel is defined as R, a thickness of the curved member is defined as D, and a distance between a center of each of the two adjacent printed circuit boards is defined as W, a minimum value of a difference between the first distance and the second distance ranges from $9*D*W/20*R$ to $11*D*W/20*R$.

* * * * *